US012757341B2

(12) United States Patent

Nishihara

(10) Patent No.: US 12,757,341 B2
(45) Date of Patent: Oct. 6, 2026

(54) SEMICONDUCTOR STORAGE DEVICE

(71) Applicant: Kioxia Corporation, Tokyo (JP)

(72) Inventor: Kiyohito Nishihara, Hiratsuka Kanagawa (JP)

(73) Assignee: Kioxia Corporation, Tokyo (JP)

(*) Notice: Subject to any disclaimer, the term of this patent is extended or adjusted under 35 U.S.C. 154(b) by 91 days.

(21) Appl. No.: 18/827,675

(22) Filed: Sep. 7, 2024

(65) Prior Publication Data

US 2025/0294693 A1 Sep. 18, 2025

(30) Foreign Application Priority Data

Mar. 15, 2024 (JP) ................................ 2024-041472

(51) Int. Cl.

| | |
|---|---|
| ***H05K 5/02*** | (2006.01) |
| ***H10B 80/00*** | (2023.01) |
| ***H10W 90/00*** | (2026.01) |
| *H10W 90/20* | (2026.01) |
| *H10W 90/24* | (2026.01) |

(52) U.S. Cl.

CPC ........... *H05K 5/0256* (2013.01); *H10B 80/00* (2023.02); *H10W 90/00* (2026.01); *H10W 90/24* (2026.01); *H10W 90/291* (2026.01); *H10W 90/754* (2026.01)

(58) Field of Classification Search

CPC ............... H05K 5/0256; H05K 5/0017; H05K 5/0217

USPC .......................................................... 361/736

See application file for complete search history.

(56) References Cited

U.S. PATENT DOCUMENTS

| | | | | |
|---|---|---|---|---|
| 2016/0050744 A1* | 2/2016 | Lee | H05K 1/0206 361/712 |
| 2017/0365564 A1 | 12/2017 | Yu et al. | |
| 2019/0164888 A1 | 5/2019 | Chang Chien et al. | |
| 2021/0296224 A1 | 9/2021 | Sano | |
| 2022/0059493 A1 | 2/2022 | Okada et al. | |

(Continued)

FOREIGN PATENT DOCUMENTS

| | | | |
|---|---|---|---|
| TW | 201801276 A | 1/2018 | |
| TW | 202137502 A | 10/2021 | |
| WO | WO-2023026510 A1 * | 3/2023 | H01L 25/0652 |

OTHER PUBLICATIONS

Specification of U.S. Appl. No. 18/884,004, First Named Inventor: Kiyohito Nishihara ; Title: "Semiconductor Storage Device and Semiconductor Storage Unit"; filed Sep. 12, 2024.

*Primary Examiner* — Hung S. Bui

(74) *Attorney, Agent, or Firm* — Holtz, Holtz & Volek PC

(57) ABSTRACT

A semiconductor storage device according to one embodiment includes a first board, a molded resin, and a memory chip. The first board has a first surface and a second surface on a side opposite to the first surface. The molded resin covers the first surface when viewed in a thickness direction of the first board. The memory chip is between the first surface and the molded resin. The first board includes a terminal on the second surface and exposed to the outside. The terminal includes a first non-planar portion. The first non-planar portion includes at least one of a plurality of recesses and a plurality of protrusions. The first non-planar portion includes a first recessed portion and a first protruding portion. The first recessed portion and the first protruding portion are aligned alternately on the first non-planar portion.

17 Claims, 26 Drawing Sheets

(56) References Cited

U.S. PATENT DOCUMENTS

| | | | |
|---|---|---|---|
| 2022/0102239 A1 | 3/2022 | Kamoda et al. | |
| 2023/0004310 A1 | 1/2023 | Kondo et al. | |
| 2023/0091779 A1* | 3/2023 | Sato ................. | G06K 19/07732 439/68 |
| 2023/0137512 A1 | 5/2023 | Xu et al. | |

* cited by examiner

SEMICONDUCTOR STORAGE DEVICE

CROSS-REFERENCE TO RELATED APPLICATION

This application is based upon and claims the benefit of priority from Japanese Patent Application No. 2024-041472 filed in Japan on Mar. 15, 2024; the entire contents of which are incorporated herein by reference.

FIELD

Embodiments of the present invention relate to a semiconductor storage device.

BACKGROUND ART

A semiconductor storage device having a board, a memory chip mounted on a first surface of the board, and a plurality of terminals provided on a second surface of the board is known.

DETAILED DESCRIPTION

A semiconductor storage device according to one embodiment includes a first board, a molded resin, and a memory chip. The first board includes a first surface and a second surface. The second surface is on a side opposite to the first surface. The molded resin covers the first surface when viewed in a thickness direction of the first board. The memory chip is between the first surface and the molded resin. The first board includes a terminal. The terminal is on the second surface. The terminal is exposed to the outside. The terminal includes a first non-planar portion. The first non-planar portion includes at least one of a plurality of recesses and a plurality of protrusions. The first non-planar portion includes a first recessed portion and a first protruding portion. The first recessed portion and the first protruding portion are aligned alternately on the first non-planar portion.

Hereinafter, a semiconductor storage device according to an embodiment will be described with reference to the drawings. In the following description, components having the same or similar functions are denoted by the same reference signs. Also, duplicate description of the components may be omitted. In the following description, when a reference sign is appended with a number or an alphabetical letter at the end for distinction, the number or the alphabetical letter at the end may be omitted when there is no need for distinguishing.

In the present application, terms are defined as follows. “Parallel”, “orthogonal”, or “the same” may include a case of “substantially parallel”, “substantially orthogonal”, or “substantially the same”. “Connection” is not limited to a case of being mechanically connected, and may also include a case of being electrically connected. That is, “connection” is not limited to a case in which two elements to be connected are directly connected, and may include a case in which two elements to be connected are connected with another element interposed therebetween. Also, “connection” is not limited to being coupled, and may include a case of merely being in contact.

An X direction, a Y direction, and a Z direction are defined as follows. The X direction and the Y direction are directions along a first surface 11*a* (see FIG. 2) of a board 11 to be described later. The X direction is a direction from a region A1 to a region A2 to be described later (see FIG. 1). The Y direction is a direction that intersects (for example, is orthogonal to) the X direction. The Z direction is a direction that intersects (for example, is orthogonal to) the X direction and the Y direction. The Z direction is, for example, a thickness direction of the board 11. The X direction is an example of a “first direction”. The Y direction is an example of a “second direction”.

First Embodiment

<1. External Configuration of Semiconductor Storage Device>

Figure 1:
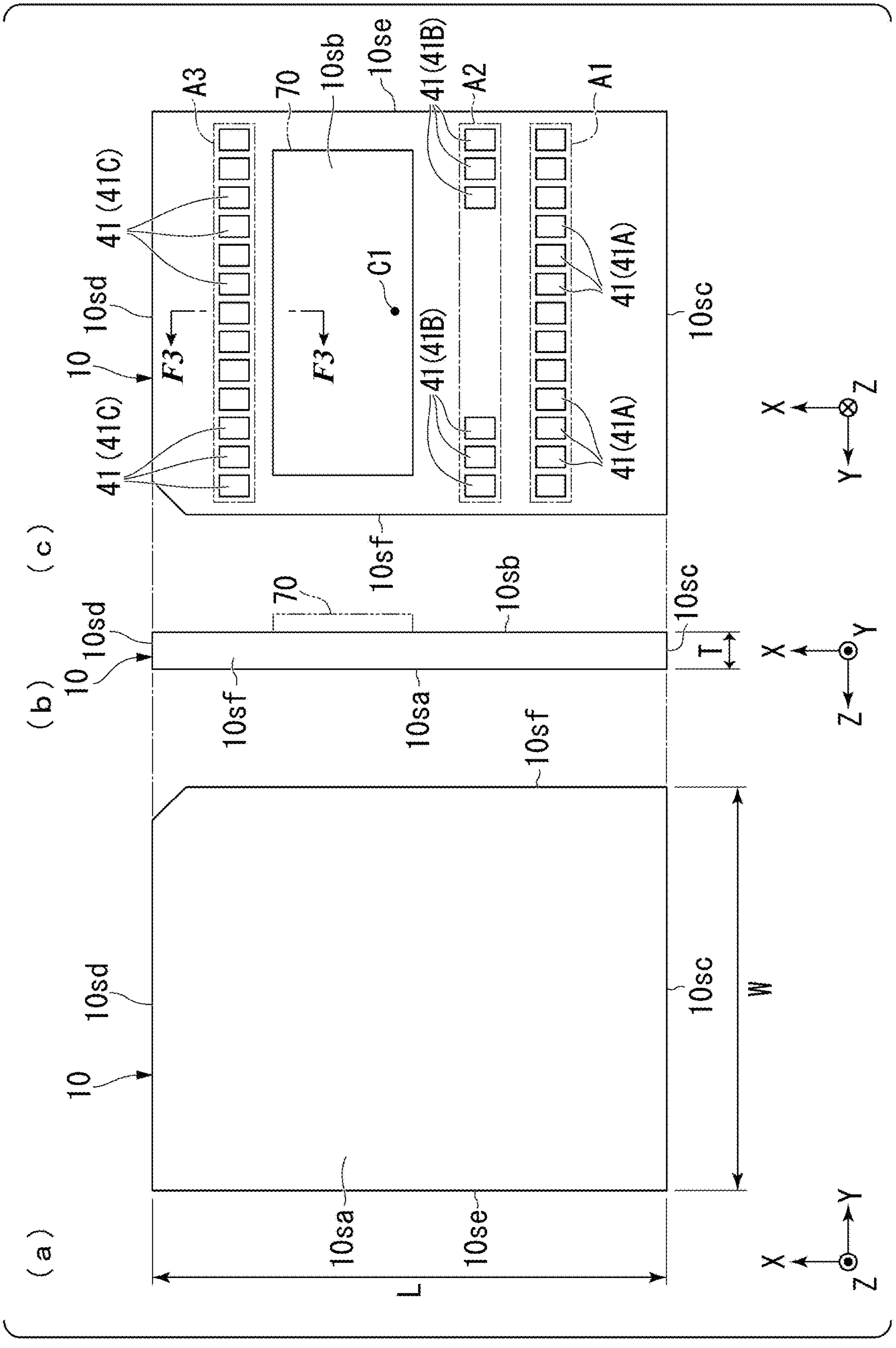
FIG. 1 is a view showing a semiconductor storage device according to a first embodiment.

FIG. 1 is a view showing a semiconductor storage device 10 according to a first embodiment. PART (a) of FIG. 1 shows a surface on one side of the semiconductor storage device 10. PART (b) of FIG. 1 shows one lateral surface of the semiconductor storage device 10. PART (c) of FIG. 1 shows a surface on the other side of the semiconductor storage device 10.

The semiconductor storage device 10 is a semiconductor storage device such as, for example, a solid state drive (SSD). The semiconductor storage device 10 has, for example, a system in package (SiP) structure. The semiconductor storage device 10 is attached to a host device. The semiconductor storage device 10 is used as a storage device of the host device. The host device may be a personal computer, a mobile device, a video recorder, an in-vehicle device, or the like, but is not limited to these examples. In the following, an example in which the semiconductor storage device 10 is attached to a host device HS (see FIG. 6) will be described.

The semiconductor storage device 10 is, for example, a card-type semiconductor storage device such as a memory card. For example, the semiconductor storage device 10 has a length L in the X direction, a width W in the Y direction, and a thickness T in the Z direction. The length L is larger than the width W. An example of the length L is 18 mm+0.10 mm. An example of the width W is 14 mm+0.10 mm. An example of the thickness T is 1.4 mm+0.10 mm. However, the standards and numerical values described above do not limit the contents of the present embodiment.

As shown in FIG. 1, the semiconductor storage device 10 has a first main surface 10*sa*, a second main surface 10*sb*, a first end surface 10*sc*, a second end surface 10*sd*, a first side surface 10*se*, and a second side surface 10*sf*.

The first main surface 10*sa* and the second main surface 10*sb* are widest surfaces among the six surfaces described above. The second main surface 10*sb* is positioned on a side opposite to the first main surface 10*sa*. The first main surface 10*sa* and the second main surface 10*sb* are spaced apart in the Z direction. The first main surface 10*sa* and the second main surface 10*sb* extend in the X direction and the Y direction. A plurality of terminals 41 to be described later are provided on the second main surface 10*sb*. The plurality of terminals 41 are exposed to the outside on the second main surface 10*sb*.

The first end surface 10*sc* and the second end surface 10*sd* are spaced apart in the X direction. The first end surface 10*sc* and the second end surface 10*sd* extend in the Y direction and the Z direction. The first end surface 10*sc* connects one end of the first main surface 10*sa* in the X direction and one end of the second main surface 10*sb* in the X direction. The second end surface 10*sd* connects the other end of the first main surface 10*sa* in the X direction and the other end of the second main surface 10*sb* in the X direction.

The first side surface 10*se* and the second side surface 10*sf* are spaced apart in the Y direction. The first side surface 10*se* and the second side surface 10*sf* extend in the X direction and the Z direction. The first side surface 10*se* connects one end of the first main surface 10*sa* in the Y direction and one end of the second main surface 10*sb* in the Y direction. The second side surface 10*sf* connects the other end of the first main surface 10*sa* in the Y direction and the other end of the second main surface 10*sb* in the Y direction.

In the present embodiment, the semiconductor storage device 10 includes regions A1 to A3. The region A1 is disposed between a center C1 of the semiconductor storage device 10 in the X direction and the first end surface 10*sc*. In the region A1, a plurality of terminals 41A are disposed as the terminal 41. The plurality of terminals 41A are aligned in one row in the Y direction. The region A2 is disposed between the center C1 of the semiconductor storage device 10 in the X direction and the region A1. In the region A2, a plurality of terminals 41B are disposed as the terminal 41. The plurality of terminals 41B are disposed in one row in the Y direction. The region A3 is disposed between the center C1 of the semiconductor storage device 10 in the X direction and the second end surface 10*sd*. In the region A3, a plurality of terminals 41C are disposed as the terminal 41. The plurality of terminals 41C are disposed in one row in the Y direction.

<2. Internal Configuration of Semiconductor Storage Device>

Next, an internal configuration of the semiconductor storage device 10 will be described.

Figure 2:
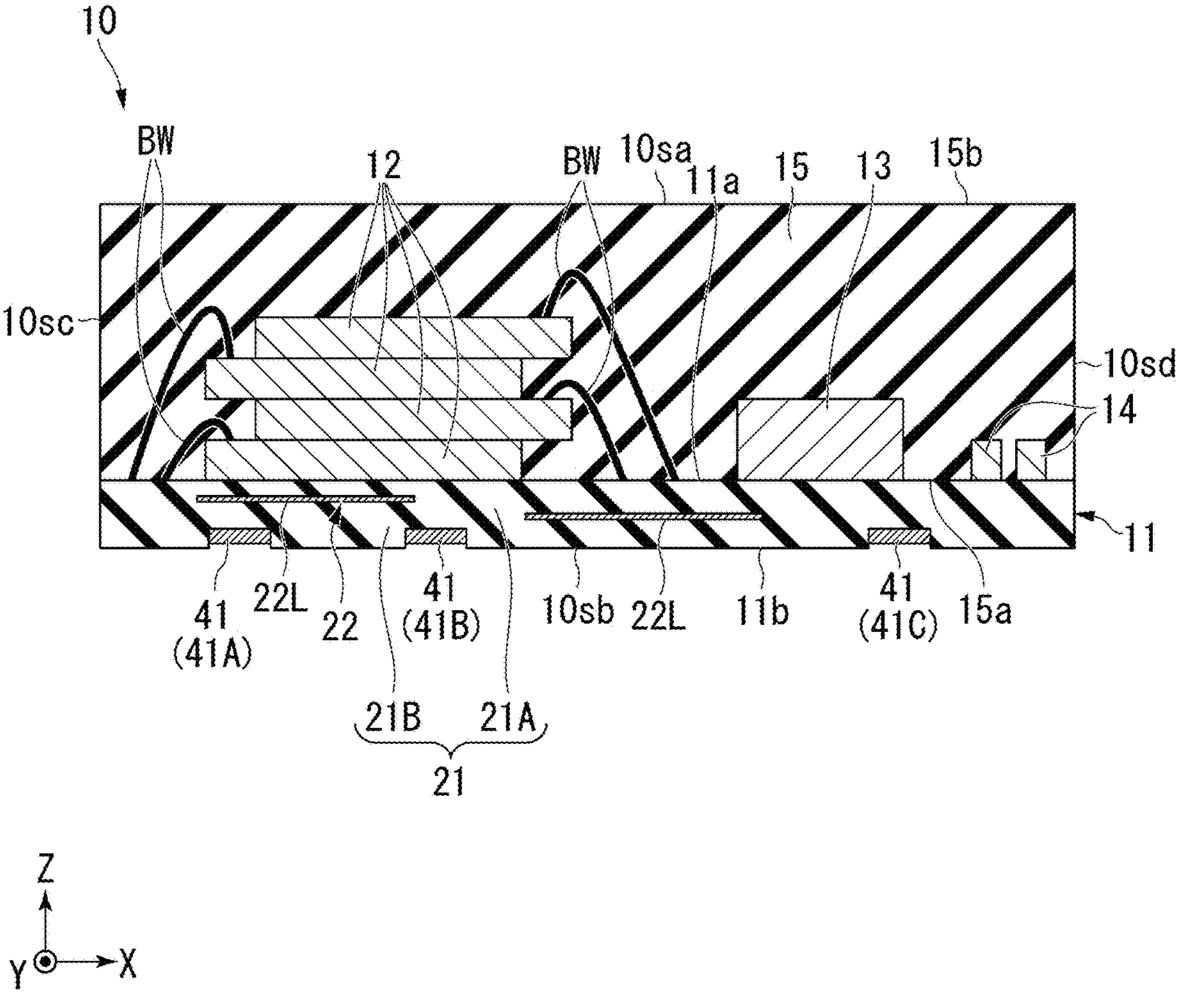
FIG. 2 is a cross-sectional view showing the semiconductor storage device according to the first embodiment.

FIG. 2 is a cross-sectional view showing the semiconductor storage device 10. The semiconductor storage device 10 includes, for example, a board 11, one or more (for example, a plurality of) memory chips 12, a controller 13, one or more (for example, a plurality of) electronic components 14, and a molded resin 15.

<2.1 Board>

The board 11 is a printed circuit board. The board 11 has a plate shape extending in the X direction and the Y direction. The board 11 is an example of a "first board". The board 11 has a first surface 11*a* and a second surface 11*b*. The first surface 11*a* and the second surface 11*b* are spaced apart in the Z direction. The first surface 11*a* and the second surface 11*b* extend in the X direction and the Y direction. The first surface 11*a* is a surface that is covered with the molded resin 15 when viewed from the Z direction. The second surface 11*b* is a surface positioned on a side opposite to the first surface 11*a*. The second surface 11*b* is exposed to the outside of the semiconductor storage device 10. The second surface 11*b* forms the second main surface 10*sb* of the semiconductor storage device 10.

<2.2 Memory Chip>

Each of the plurality of memory chips 12 is a semiconductor memory chip that stores data non-volatilely. The memory chip 12 is, for example, a NAND type flash memory. However, the "semiconductor memory" is not limited to a NAND flash memory, and may be other types of memory such as a NOR type memory, a magnetoresistive random access memory (MRAM), or a variable resistance memory. The memory chip 12 generates heat when the semiconductor storage device 10 is in use.

The memory chip 12 is disposed between the first surface 11*a* of the board 11 and the molded resin 15. The plurality of memory chips 12 are, for example, stacked with each other and mounted on the first surface 11*a* of the board 11. Note that, the memory chip 12 may be stacked above the controller 13 from a side opposite to the board 11 instead of being mounted on the first surface 11*a* of the board 11. The plurality of memory chips 12 are electrically connected to the first surface 11*a* of the board 11 via, for example, bonding wires BW.

<2.3 Controller>

The controller 13 is a control component mounted on the board 11. The controller 13 is configured to comprehensively control the entirety of the semiconductor storage device 10. The controller 13 controls a write operation, a read operation, or the like for the plurality of memory chips 12. The controller 13 is, for example, a controller chip in which functional units for control are integrated into one semiconductor chip. The controller 13 is a semiconductor package. Such a semiconductor package includes a system on a chip (SoC). In the system on a chip, for example, a host interface circuit for communicating with a host device, a control circuit configured to control the plurality of memory chips 12, a control circuit configured to control a DRAM (not shown in the drawings), and the like are integrated into one semiconductor chip. The controller 13 is disposed between the first surface 11*a* of the board 11 and the molded resin 15. The controller 13 is mounted on, for example, the first surface 11*a* of the board 11. The controller 13 generates heat when the semiconductor storage device 10 is in use.

<2.4 Electronic Component>

The electronic component 14 is mounted on the first surface 11*a* of the board 11. The electronic component 14 is a capacitor, a resistor, or the like.

<2.5 Molded Resin>

The molded resin 15 is a seal member provided on the first surface 11*a* of the board 11. The molded resin 15 is formed of an insulating material. The molded resin 15 seals, for example, the plurality of memory chips 12, the controller 13, and the plurality of electronic components 14 together.

The molded resin 15 includes a first surface 15*a* and a second surface 15*b*. The first surface 15*a* is in contact with the first surface 11*a* of the board 11. The second surface 15*b* is positioned on a side opposite to the first surface 15*a*. The second surface 15*b* extends in the X direction and the Y direction. The second surface 15*b* forms the first main surface 10*sa* of the semiconductor storage device 10.

<3. Configuration of Board>

Next, a configuration of the board 11 will be described.

As shown in FIG. 2, the board 11 is, for example, a multilayer circuit board. The board 11 includes an insulating base 21 and a wiring pattern 22.

The insulating base 21 is a base having insulating properties that forms a base portion of the board 11. The insulating base 21 is formed of, for example, a hard insulating material such as a glass epoxy material. However, the material of the insulating base 21 is not limited to the above-described example. The insulating base 21 may be formed of a paper phenol material, a composite material, a fluorine-based resin material, a polyimide material, or the like.

In the present embodiment, the insulating base 21 includes a core material 21A and a prepreg 21B stacked on the core material 21A. The prepreg 21B is positioned on the side of the second surface 11*b* with respect to the core material 21A. Note that, the board 11 is not limited to a multilayer circuit board, and may be a double-sided board. That is, the insulating base 21 may be formed only from the core material 21A without having the prepreg 21B. Therefore, in the following description, the "insulating base 21" may be read as the "core material 21A", and a "surface 21*s* of the insulating base 21" may be read as a "surface 21*s* of the core material 21A".

The wiring pattern 22 is a conductive portion provided on the board 11. The wiring pattern 22 includes a wiring 22L provided on at least one of the inside of the insulating base 21 and a surface of the board 11. The wiring pattern 22 is formed of a metal material such as copper.

<4. Configuration of Surface Layer Portion of Board>

Next, a surface layer portion 30 of the board 11 will be described.

Figure 3:
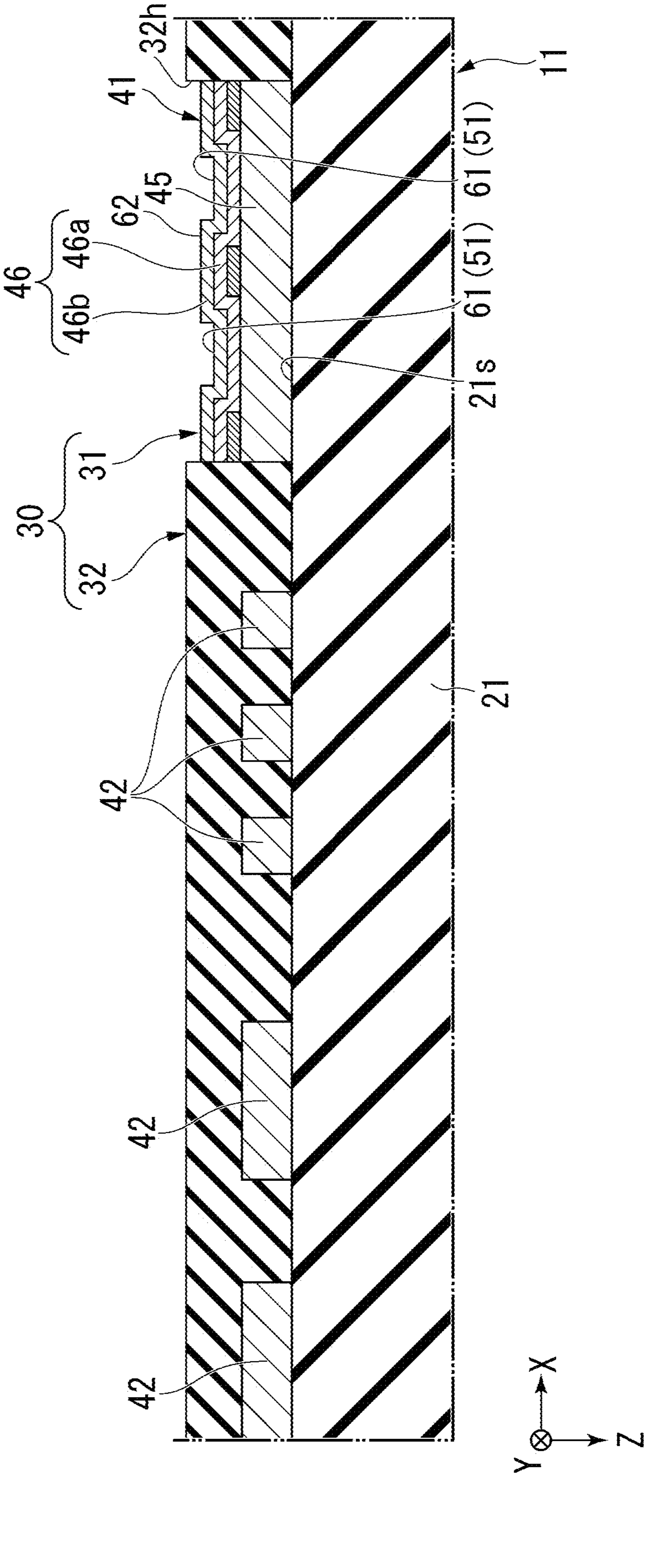
FIG. 3 is a cross-sectional view showing the semiconductor storage device along line F3-F3 shown in FIG. 1.

FIG. 3 is a cross-sectional view showing the semiconductor storage device 10 along line F3-F3 shown in FIG. 1. Note that, for convenience of explanation, FIG. 3 schematically shows a shape of the terminal 41 (the number of recessed portions 61 and protruding portions 62 to be described later). As shown in FIG. 3, the board 11 has the surface layer portion 30. The surface layer portion 30 is a portion that is stacked on the insulating base 21 to form the second surface 11*b* of the board 11. The surface layer portion 30 includes a conductive pattern 31 and a solder resist layer 32.

The conductive pattern 31 is a conductive portion included in the surface layer portion 30 as a part of the wiring pattern 22. The conductive pattern 31 has the plurality of terminals 41 (only one is shown in FIG. 3) and a plurality of wirings 42.

(Terminal)

The plurality of terminals 41 are terminals exposed to the outside of the semiconductor storage device 10 to be electrically connected to the host device HS. Each of the terminals 41 is a pad with which, for example, a contact pin 92 (see FIG. 6) of the host device HS comes into contact. The plurality of terminals 41 are provided, for example, on a surface 21*s* of the insulating base 21. Each of the terminals 41 is exposed to the outside of the semiconductor storage device 10 through an opening 32*h* of the solder resist layer 32. Each of the plurality of terminals 41 is, for example, a signal terminal, a power terminal, or a ground terminal. Note that, a part of the plurality of terminals 41 may be a test terminal.

Each terminal 41 includes a main body portion 45 and a protective film 46. The main body portion 45 is formed of, for example, a metal material (first metal material) such as copper. The protective film 46 is stacked on the main body portion 45 from a side opposite to the insulating base 21. The protective film 46 is, for example, a plating layer provided for rust prevention. The protective film 46 is formed of, for example, a metal material such as gold or nickel.

In the present embodiment, the protective film 46 includes, for example, a first metal film 46*a* and a second metal film 46*b*. The first metal film 46*a* is stacked on the main body portion 45. The first metal film 46*a* is formed of a metal material (second metal material) such as nickel. The second metal material is a metal material that has superior adhesion to the first metal material (for example, copper) compared to a third metal material to be described below. The second metal material is, for example, nickel, titanium, tantalum, titanium nitride, tungsten, or tungsten nitride.

The second metal film 46*b* is stacked on the first metal film 46*a* from a side opposite to the main body portion 45. The second metal film 46*b* is exposed to the outside of the semiconductor storage device 10. The second metal film 46*b* is formed of a metal material (third metal material) such as gold.

(Wiring)

The plurality of wirings 42 are wirings included in the surface layer portion 30 as a part of the wiring 22L. The plurality of wirings 42 are provided on the surface 21*s* of the insulating base 21. At least a part of the plurality of wirings 42 is electrically connected to the terminal 41.

<4.2 Solder Resist Layer>

The solder resist layer 32 is a protective layer having insulating properties that protects the conductive pattern 31. The solder resist layer 32 is an example of an "insulating layer". The solder resist layer 32 is provided, for example, on the surface 21*s* of the insulating base. The solder resist layer 32 has the opening 32*h* that exposes the terminal 41. The solder resist layer 32 covers a part of the conductive pattern 31. For example, the solder resist layer 32 covers the plurality of wirings 42.

<5. Shape of Terminal>

Next, a shape of the terminal 41 of the semiconductor storage device 10 will be described.

Figure 4:
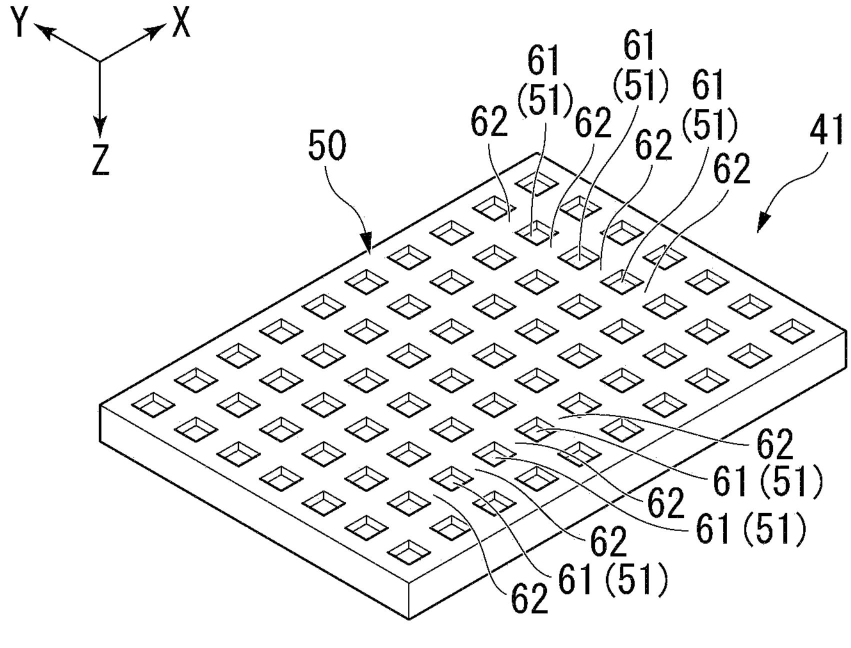
FIG. 4 is a perspective view showing a terminal of the semiconductor storage device according to the first embodiment.

FIG. 4 is a perspective view showing the terminal 41 of the semiconductor storage device 10. In the present embodiment, the terminal 41 has a non-planar portion 50. The non-planar portion 50 is an example of a "first non-planar portion".

In the present embodiment, the non-planar portion 50 has a plurality of recesses 51. In the example shown in FIG. 4, the plurality of recesses 51 are disposed to be aligned in a matrix shape of ten rows in the X direction and seven rows in the Y direction. Each of the recesses 51 is a bottomed hole provided on a surface of the terminal 41. In the present embodiment, the non-planar portion 50 has an uneven structure in which the recessed portions 61 and the protruding portions 62 are alternately disposed due to provision of the plurality of recesses 51. For example, the recessed portions 61 and the protruding portions 62 are alternately aligned in each of the X direction and the Y direction. The recessed portion 61 is an example of a "first recessed portion". The protruding portion 62 is an example of a "first protruding portion". Note that, in the present application, the phrase "the recessed portions and the protruding portions are alternately aligned" means that a total of the recessed portion and the protruding portion need only be three or more. For example, an uneven structure only having two recessed portions and one protruding portion defined between the two recessed portions or an uneven structure only having two protruding portions and one recessed portion defined between the two protruding portions corresponds to an example of the "structure in which the recessed portions and the protruding portions are alternately aligned" as referred to in the present application. Note that, the non-planar portion 50 does not need to be provided over the entire region of the terminal 41, and may be provided over only a partial region of the terminal 41.

<5.1 Shape of Recessed Portion>

Figure 5A:
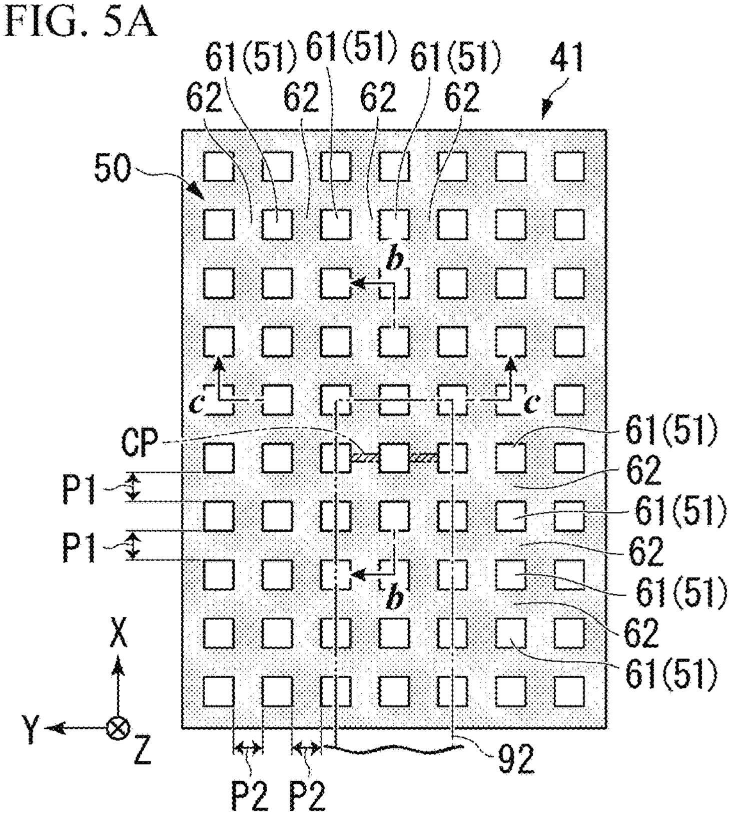
FIG. 5A is a plan view showing the terminal of the semiconductor storage device according to the first embodiment.
Figure 5B:
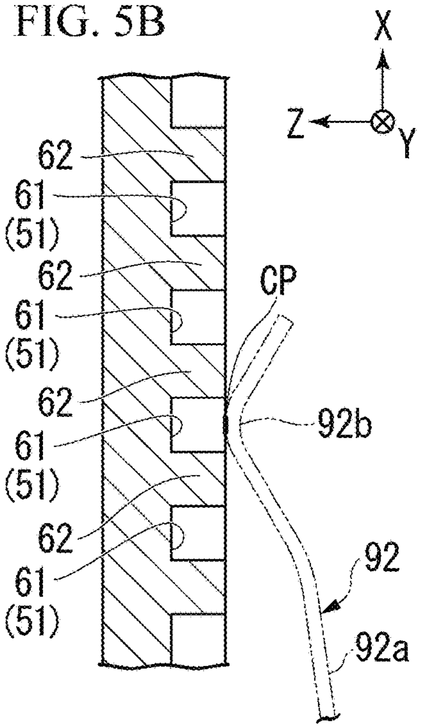
FIG. 5B is a view showing the terminal of the semiconductor storage device according to the first embodiment, and is a cross-sectional view taken along line b-b shown in FIG. 5A.
Figure 5C:
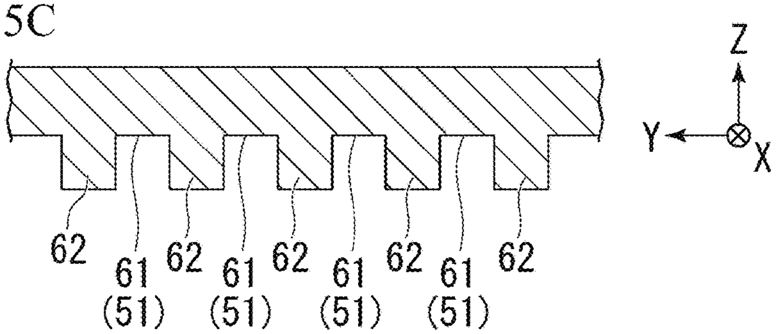
FIG. 5C is a view showing the terminal of the semiconductor storage device according to the first embodiment, and is a cross-sectional view taken along line c-c shown in FIG. 5A.

FIGS. 5A to 5C are views showing the terminal 41 of the semiconductor storage device 10. The recessed portion 61 is formed by the recess 51. In other words, the "recessed portion 61" may be read as the "recess 51". The plurality of recessed portions 61 are disposed at regular intervals at an interval P1 in the X direction. A width of the recessed portion 61 in the X direction is, for example, equal to or larger than the interval P1. Also, the plurality of recessed portions 61 are disposed at regular intervals at an interval P2 in the Y direction. A width of the recessed portion 61 in the Y direction is, for example, equal to or larger than the interval P2. The recessed portion 61 has a polygonal shape when viewed from the Z direction. In the present embodiment, the recessed portion 61 has a quadrangular shape when viewed from the Z direction. However, the recessed portion 61 may have a triangular shape or a polygonal shape with five or more sides, may have a linear shape, or may have a circular shape. A depth of the recessed portion 61 is, for example, 1 μm or more. In the present embodiment, the depth of the recessed portion 61 is several micrometers to tens of micrometers. Each width in the X direction and the Y direction of the recessed portion 61 is, for example, 1 μm or more. In the present embodiment, each width in the X direction and the Y direction of the recessed portion 61 is several micrometers to hundreds of micrometers.

<5.2 Shape of Protruding Portion>

The protruding portion 62 is a portion defined between two recessed portions 61 adjacent to each other due to provision of the plurality of recessed portions 61. In the present application, the term "protruding portion" refers to a portion that protrudes in a direction away from the insulating base 21 compared to a bottom of the recessed portion. In the present embodiment, the protruding portion 62 is defined between two recessed portions 61 adjacent to each other in the X direction or the Y direction.

In the present embodiment, the protruding portions 62 extend in a direction parallel to the second surface 11*b* of the board 11. For example, the protruding portions 62 extend linearly in each of the X direction and the Y direction. For example, the plurality of protruding portions 62 include: nine protruding portions 62 that are spaced apart from each other in the X direction and extend in the Y direction; and six protruding portions 62 that are spaced apart from each other in the Y direction and extend in the X direction. Each of the nine protruding portions 62 extends over a half or more of a width of the terminal 41 in the Y direction. Each of the six protruding portions 62 extends over a half or more of a width of the terminal 41 in the X direction. At each of portions in which the nine protruding portions 62 and the six protruding portions 62 intersect, a connection portion in which the protruding portions 62 extending in the X direction and the protruding portions 62 extending in the Y direction are connected in a cross shape is formed.

In the present embodiment, the contact pin 92 of a connector 90 of the host device HS to be described later has an extension portion 92*a* and a curved portion 92*b*. The extension portion 92*a* linearly extends gradually toward the terminal 41. The extension portion 92*a* extends in the X direction. The curved portion 92*b* is provided at a distal end part of the contact pin 92. The curved portion 92*b* is curved toward a side opposite to the terminal 41. The curved portion 92*b* is a contact portion of the contact pin 92. In the present embodiment, the protruding portion 62 of the terminal 41 comes into contact with the curved portion 92*b* of the contact pin 92. That is, a contact portion CP between the terminal 41 and the contact pin 92 is formed between the protruding portion 62 and the curved portion 92*b* of the contact pin 92. Therefore, the terminal 41 and the host device HS are electrically connected.

<6. Thermally Conductive Sheet>

Next, returning to FIG. 1, a thermally conductive sheet 70 will be described. The thermally conductive sheet 70 is, for example, a sheet having higher thermal conductivity than the solder resist layer 32. The thermally conductive sheet 70 has a thermal conductivity of, for example, 1.0 W/(m·K) or more. The thermally conductive sheet 70 is formed of, for example, silicone. When viewed from the Z direction, the thermally conductive sheet 70 is disposed to overlap a flat region of the semiconductor storage device 10 positioned between the region A2 and the region A3. The thermally conductive sheet 70 is in contact with the second main surface 10*sb* of the semiconductor storage device 10. Note that, the thermally conductive sheet 70 does not need to be fixed to the semiconductor storage device 10, and may simply be in contact with the semiconductor storage device 10.

<7. Connector of Host Device>

Next, the connector 90 of the host device HS will be described.

Figure 6:
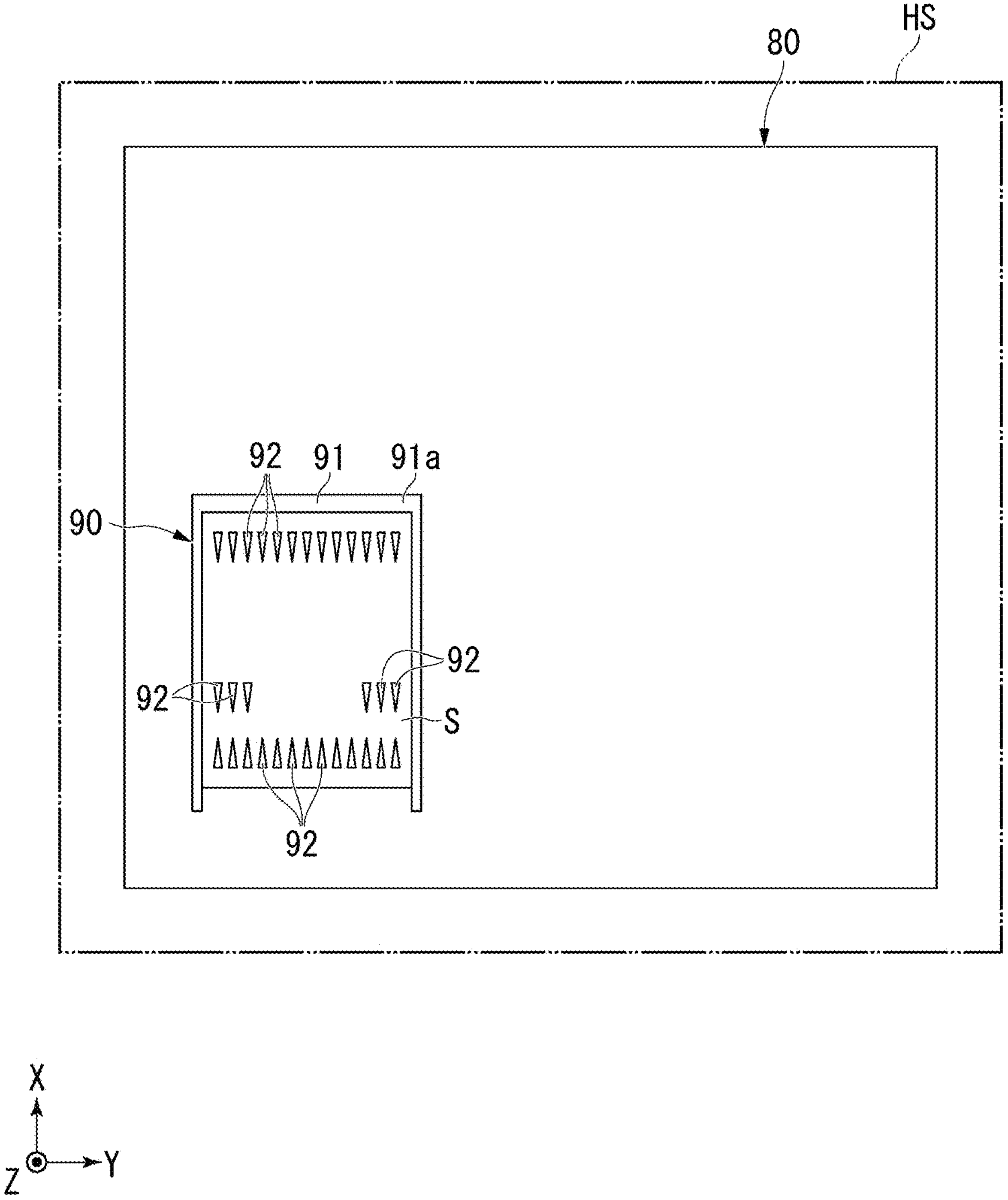
FIG. 6 is a plan view showing a board of a host device according to the first embodiment.

FIG. 6 is a plan view showing a board 80 of the host device HS. In the following, for convenience of explanation, the board 80 of the host device HS will be referred to as a "host board 80". The host board 80 is an example of a "second board". The host board 80 has the socket connector 90 (for example, a clamshell-type socket connector). The semiconductor storage device 10 can be detachably attached to the connector 90 manually. For example, the semiconductor storage device 10 can be removed from the connector 90 and easily replaced in the event of a malfunction or the like. The connector 90 includes, for example, a connector main body 91, a plurality of contact pins 92, and a holder 93 (see FIG. 7).

(Connector Main Body)

The connector main body 91 is a portion that forms a main portion of an outer shape of the connector 90. The connector main body 91 is fixed to the host board 80. The connector main body 91 is electrically connected to the host board 80. The connector main body 91 includes a housing portion S capable of housing the semiconductor storage device 10 therein. For example, one side of the connector main body 91 in the X direction is open. The connector main body 91 includes a wall portion 91*a* that surrounds the housing portion S from three directions.

(Contact Pin)

The plurality of contact pins 92 are terminals provided in the connector 90 to be connected to the plurality of terminals 41 of the semiconductor storage device 10. The plurality of contact pins 92 are disposed in the housing portion S. The plurality of contact pins 92 are exposed to the outside of the connector main body 91. The plurality of contact pins 92 are disposed at positions in one-to-one correspondence with the plurality of terminals 41 of the semiconductor storage device 10. Each of the plurality of contact pins 92 extends in the X direction. Each of the plurality of contact pins 92 is a pin-type terminal having a shape elongated in the X direction.

A base end part of each of the plurality of contact pins 92 is connected to the connector main body 91. The base end part is supported by the connector main body 91. Each of the plurality of contact pins 92 is electrically connected to the host board 80 via the connector main body 91. A distal end part (the curved portion 92*b* described above) of each of the plurality of contact pins 92 is positioned at a height above the host board 80 (see FIG. 7). Each of the plurality of contact pins 92 is disposed to be inclined with respect to a surface of the host board 80 so that the distal end part of each of the plurality of contact pins 92 is farther away from the host board 80 than the base end part. Each of the plurality of contact pins 92 is made of a metal and is elastically deformable. In the present embodiment, when the semiconductor storage device 10 is attached to the connector 90, the distal end part of each of the plurality of contact pins 92 is pressed toward the host board 80 by the semiconductor storage device 10. Therefore, each of the plurality of contact pins 92 is elastically deformed. As a result, the distal end part of each of the plurality of contact pins 92 is brought into close contact with the terminal 41 of the semiconductor storage device 10 by a restoring force of the elastic deformation.

Figure 7:
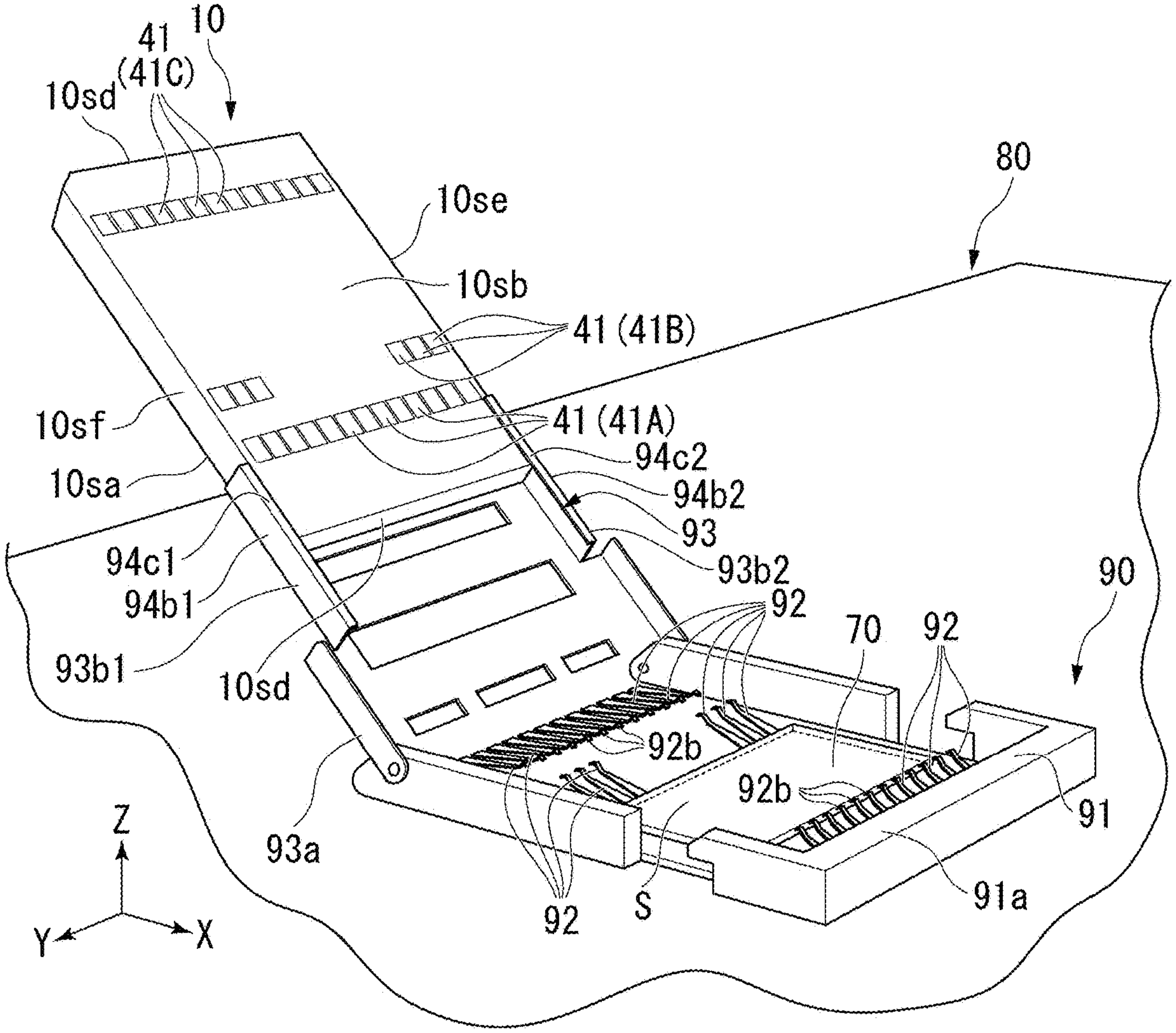
FIG. 7 is a perspective view showing a first state when the semiconductor storage device according to the first embodiment is attached.

FIG. 7 is a perspective view showing a first state when the semiconductor storage device 10 is attached. The holder 93 is a portion that holds the semiconductor storage device 10 when the semiconductor storage device 10 is attached to the connector 90. The holder 93 is rotatably connected to the connector main body 91. The holder 93 has, for example, a base end part 93*a*, a first support portion 93*b*1, and a second support portion 93*b*2.

The base end part 93*a* has a hinge structure and is rotatably connected to an end part of the connector main body 91. The first support portion 93*b*1 and the second support portion 93*b*2 are spaced apart in the Y direction and extend in a direction away from the base end part 93*a*.

The first support portion 93*b*1 has a first portion 94*a*1 (see FIG. 8), a second portion 94*b*1, and a third portion 94*c*1. The first portion 94*al* extends along the first main surface 10*sa* of the semiconductor storage device 10. The second portion 94*b*1 extends along the first side surface 10*se* of the semiconductor storage device 10. The third portion 94*cl* overlaps the second main surface 10*sb* of the semiconductor storage device 10.

Similarly, the second support portion 93*b*2 has a first portion 94*a*2 (see FIG. 8), a second portion 94*b*2, and a third portion 94*c*2. The first portion 94*a*2 extends along the first main surface 10*sa* of the semiconductor storage device 10. The second portion 94*b*2 extends along the second side surface 10*sf* of the semiconductor storage device 10. The third portion 94*c*2 overlaps the second main surface 10*sb* of the semiconductor storage device 10. The semiconductor storage device 10 is attached to the holder 93 by being inserted between the first support portion 93*b*1 and the second support portion 93*b*2.

Figure 8:
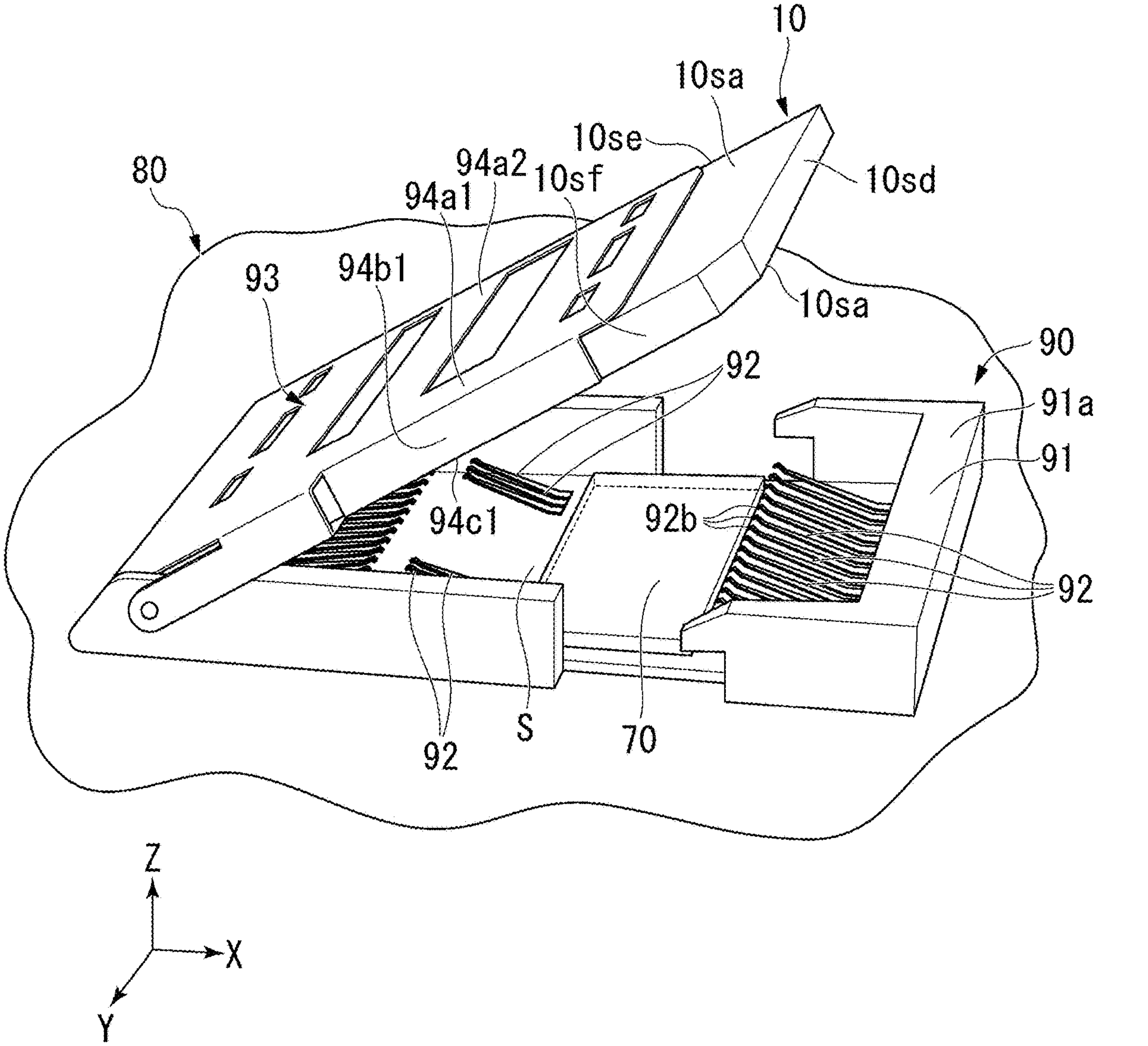
FIG. 8 is a perspective view showing a second state when the semiconductor storage device according to the first embodiment is attached.
Figure 9:
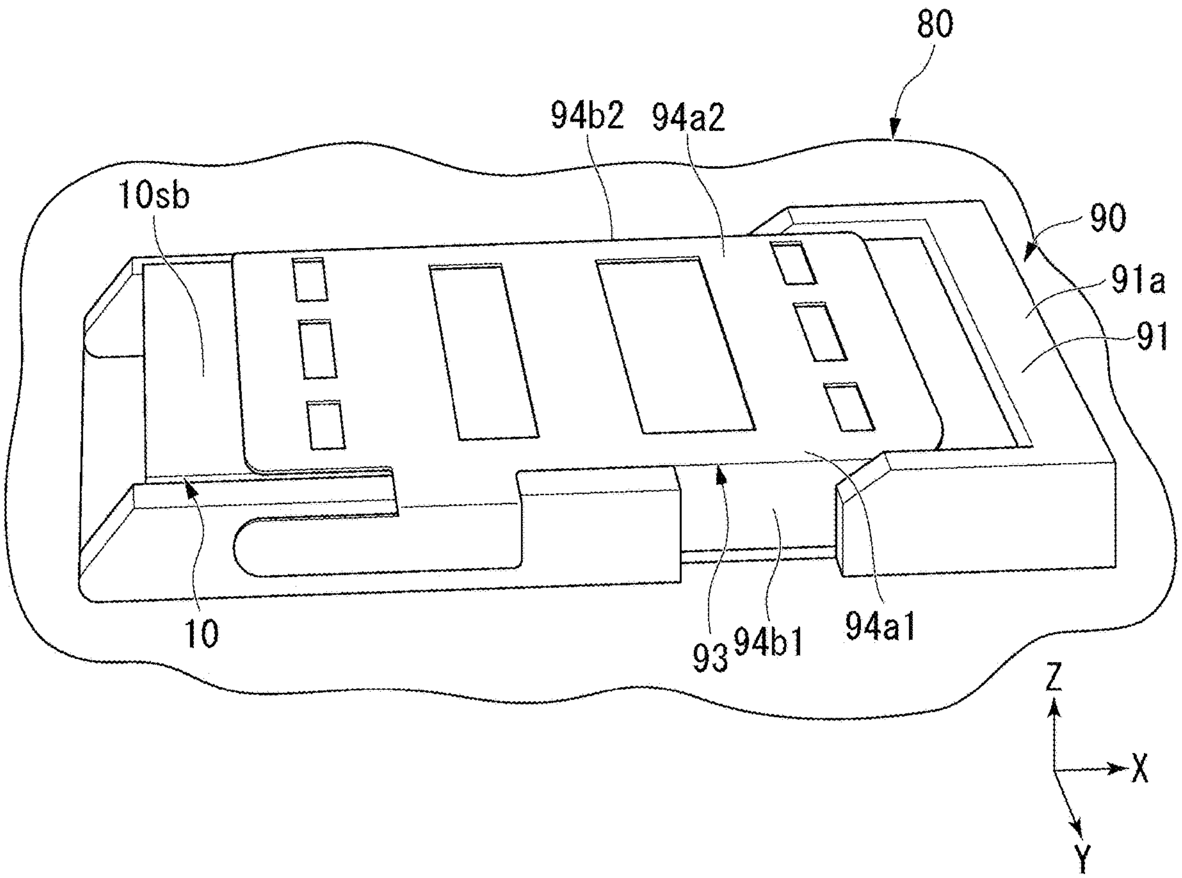
FIG. 9 is a perspective view showing a third state when the semiconductor storage device according to the first embodiment is attached.

FIG. 8 is a perspective view showing a second state when the semiconductor storage device 10 is attached. The second state shows a state in which the holder 93 is rotated from the first state toward the host board 80. FIG. 9 is a perspective view showing a third state when the semiconductor storage device 10 is attached. The third state is a state in which the holder 93 is further rotated from the second state toward the host board 80 and the semiconductor storage device 10 is housed in the housing portion S (see FIG. 8) of the connector main body 91.

Therefore, when the holder 93 is rotated toward the host board 80 after the semiconductor storage device 10 is attached to the holder 93, the semiconductor storage device 10 is detachably attached to the connector 90 with the terminals 41 of the semiconductor storage device 10 and the contact pins 92 of the connector 90 in contact with each other.

<8. Manufacturing Method>

Next, a manufacturing method of the semiconductor storage device 10 will be described.

Figure 10:
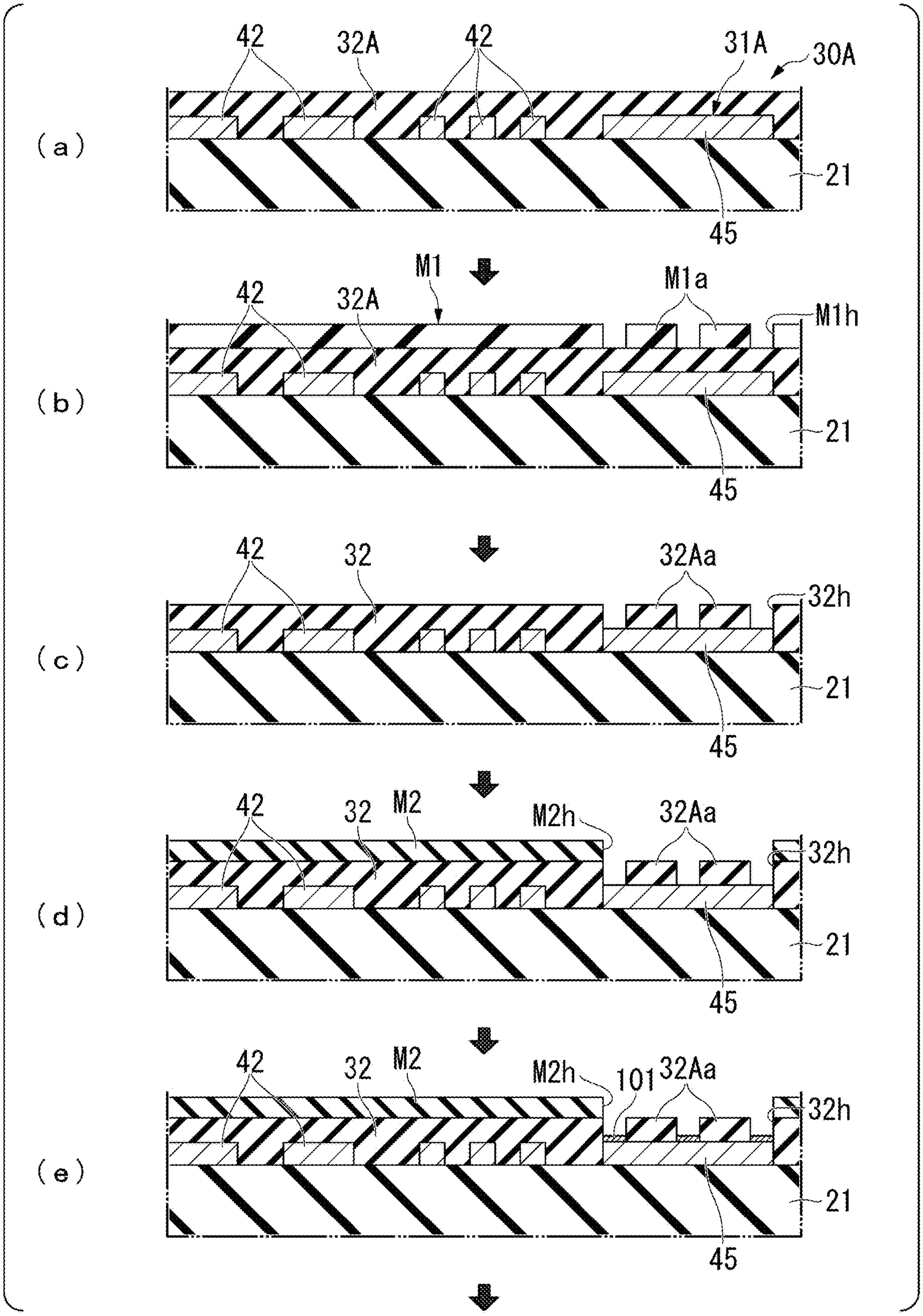
FIG. 10 is cross-sectional views showing a manufacturing method of the semiconductor storage device according to the first embodiment.
Figure 11:
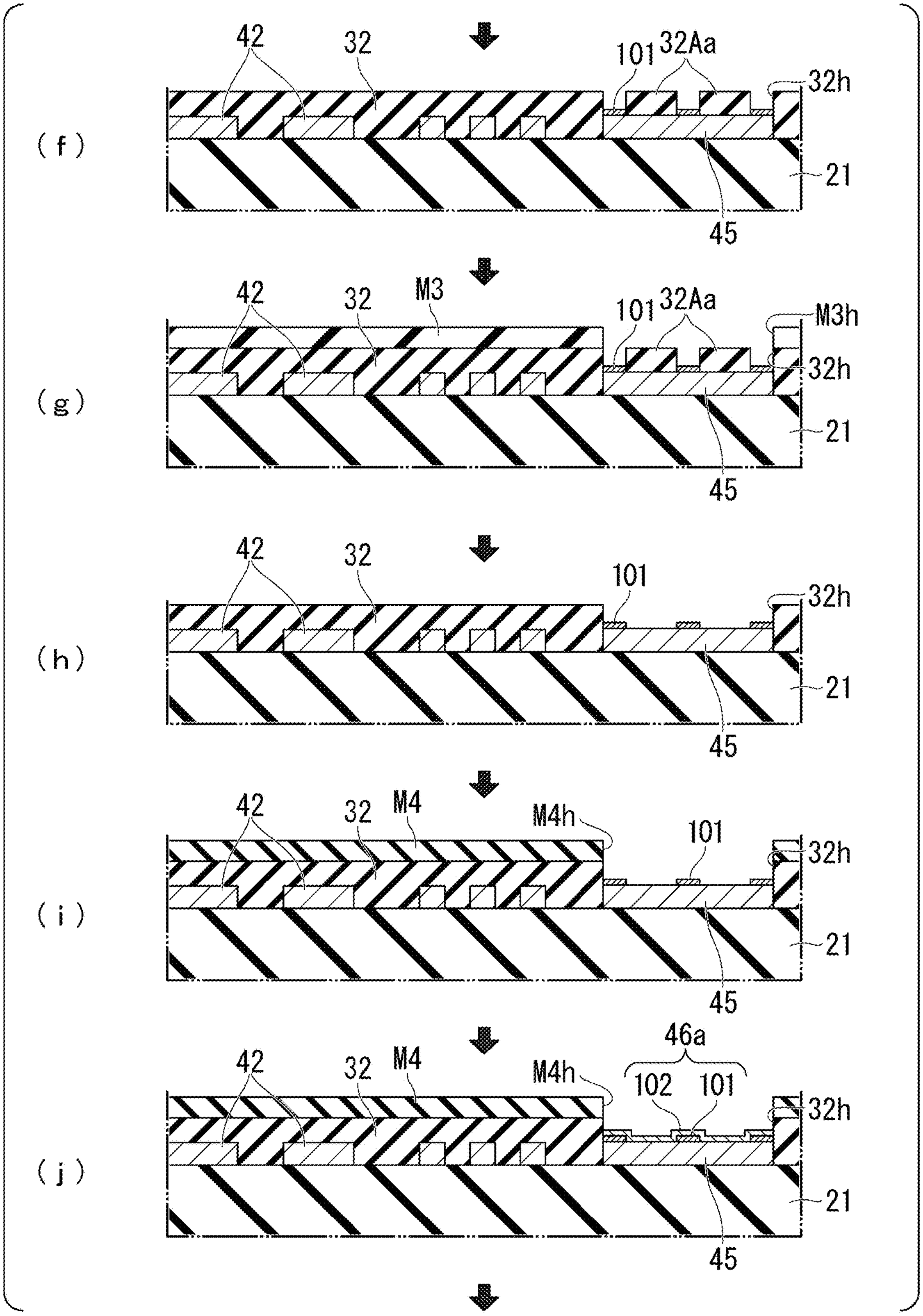
FIG. 11 is cross-sectional views showing the manufacturing method of the semiconductor storage device according to the first embodiment.
Figure 12:
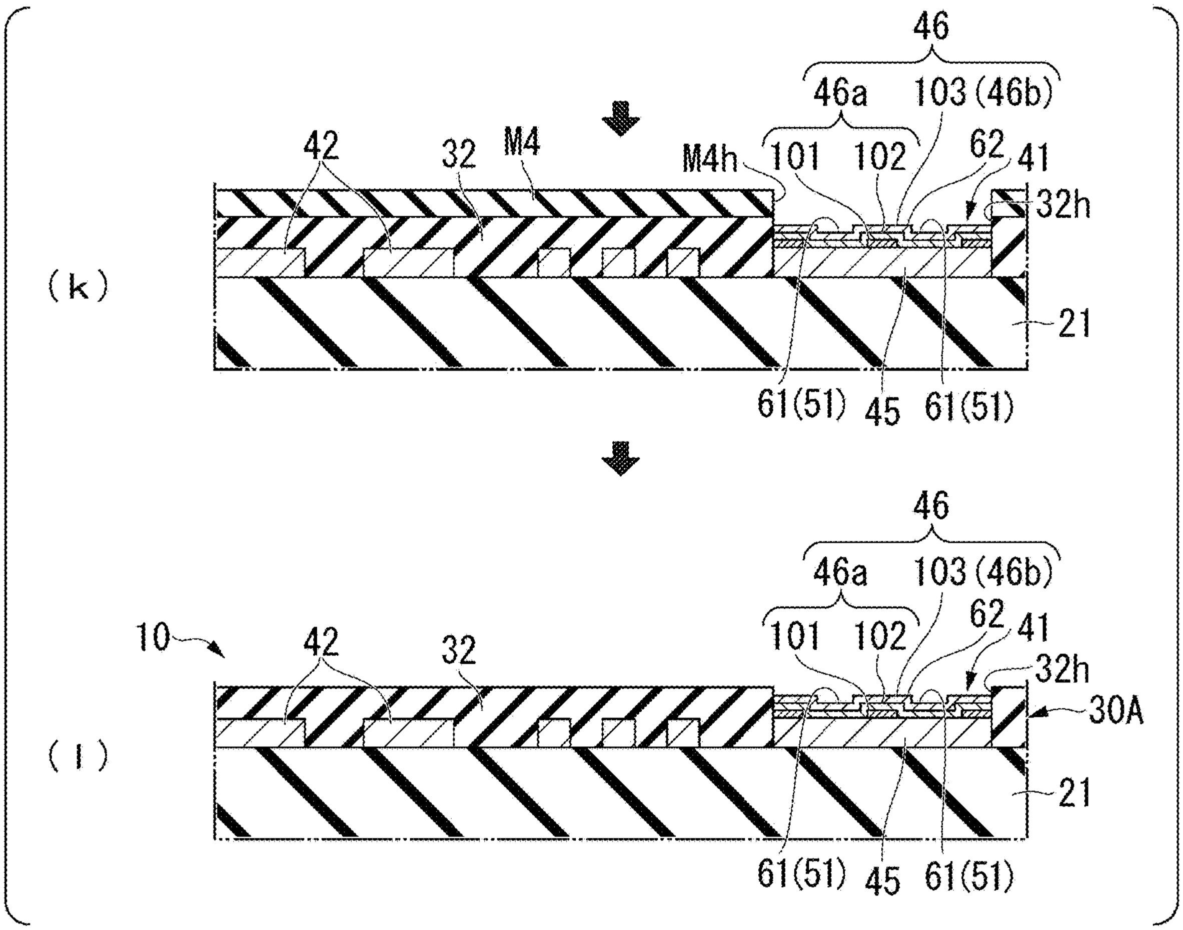
FIG. 12 is cross-sectional views showing the manufacturing method of the semiconductor storage device according to the first embodiment.

FIGS. 10 to 12 are cross-sectional views showing a manufacturing method of the semiconductor storage device 10. Note that, a shape of the terminal 41 (the number of recessed portions 61 and protruding portions 62) is schematically shown in FIGS. 10 to 12.

First, as shown in PART (a) of FIG. 10, a surface layer portion 30A is formed on the insulating base 21. The surface layer portion 30A includes a conductive pattern 31A and a solder resist layer 32A. The conductive pattern 31A is provided on the insulating base 21. The solder resist layer 32A covers the entire conductive pattern 31A. The conductive pattern 31A includes the main body portion 45 of the terminal 41 and the plurality of wirings 42.

Next, as shown in PART (b) of FIG. 10, a mask M1 is formed on the solder resist layer 32A. The mask M1 has an opening M1*h* and a cover portion M1*a* when viewed from the Z direction. The opening M1*h* is positioned to correspond to the opening 32*h* of the solder resist layer 32 to be formed in a later process. The cover portion M1*a* is positioned to correspond to the plurality of recesses 51 to be formed in a later process. Next, as shown in PART (c) of FIG. 10, a part of the solder resist layer 32A is removed by performing etching using the mask M1. Therefore, the solder resist layer 32 having the opening 32*h* is formed. Further, cover portions 32Aa are formed at respective positions corresponding to the plurality of recesses 51 to be formed in a later process. As a result, portions of the main body portion 45 of the terminal 41 that are not covered by the cover portions 32Aa are exposed to the outside through the opening 32*h*.

Next, as shown in PART (d) of FIG. 10, a mask M2 is formed on the solder resist layer 32 by, for example, dry film lamination. The mask M2 is provided on the entire region of the solder resist layer 32 except for the opening 32*h*. The mask M2 has an opening M2*h* at a position corresponding to the opening 32*h* of the solder resist layer 32. Next, as shown in PART (e) of FIG. 10, a plating treatment is performed through the opening M2*h* of the mask M2. Therefore, a first plating layer 101 is formed on portions of the main body portion 45 of the terminal 41 that are not covered by the cover portions 32Aa. The first plating layer 101 is formed of, for example, the second metal material described above.

Next, as shown in PART (f) of FIG. 11, the mask M2 is removed. Next, as shown in PART (g) of FIG. 11, a mask M3 is formed on the solder resist layer 32. The mask M3 has an opening M3*h* at a position corresponding to the opening 32*h* of the solder resist layer 32 when viewed from the Z direction. Next, as shown in PART (h) of FIG. 11, the cover portion 32Aa is removed by performing etching using the mask M3.

Next, as shown in PART (i) of FIG. 11, a mask M4 is formed on the solder resist layer 32 by, for example, dry film lamination. The mask M4 is provided on the entire region of the solder resist layer 32 except for the opening 32*h*. The mask M4 has an opening M4*h* at a position corresponding to the opening 32*h* of the solder resist layer 32. Next, as shown in PART (j) of FIG. 11, a plating treatment is performed through the opening M4*h* of the mask M4. Therefore, a second plating layer 102 is formed over the entire region of the terminal 41. The second plating layer 102 is formed of, for example, the second metal material described above. The material of the second plating layer 102 is, for example, the same as the material of the first plating layer 101. In this case, no visually recognizable boundary remains between the first plating layer 101 and the second plating layer 102. In the present embodiment, the first metal film 46*a* of the protective film 46 is formed by the first plating layer 101 and the second plating layer 102.

Next, as shown in PART (k) of FIG. 12, a plating treatment using the third metal material is performed through the opening M4*h* of the mask M4. Therefore, a third plating layer 103 is formed over the entire region of the terminal 41. The third plating layer 103 forms the second metal film 46*b* of the protective film 46. Therefore, the terminal 41 is formed. In the present embodiment, a portion of the opening 32*h* of the solder resist layer 32 on which the first plating layer 101 has not been provided is formed as the recessed portion 61 (the recess 51). Next, as shown in PART (l) of FIG. 12, the fourth mask M4 is removed. Therefore, a series of processes for manufacturing the semiconductor storage device 10 is completed.

<9. Advantages>

In the present embodiment, the terminal 41 of the semiconductor storage device 10 includes the non-planar portion 50. The non-planar portion 50 includes the plurality of recesses 51. The non-planar portion 50 includes the recessed portions 61 and the protruding portions 62. The recessed portions 61 and the protruding portions 62 are aligned alternately on the non-planar portion 50. According to such a configuration, a surface area (heat dissipation area) of the terminal 41 can be increased. Therefore, an improvement in heat dissipation of the semiconductor storage device 10 can be achieved.

In the present embodiment, the semiconductor storage device 10 can be detachably attached to the connector 90 in a state in which the contact pin 92 of the connector 90 is in contact with the terminal 41. According to such a configuration, an improvement in heat dissipation of the semiconductor storage device 10 can be achieved by utilizing the terminal 41 to which the contact pin 92 is connected.

First Modified Example of First Embodiment

Next, a first modified example of the first embodiment will be described. The first modified example differs from the first embodiment in that a planar portion 111 is provided in a region of the terminal 41 that overlaps the curved portion 92*b* of the contact pin 92. Note that, configurations other than those described below are the same as the configurations of the first embodiment.

Figure 13A:
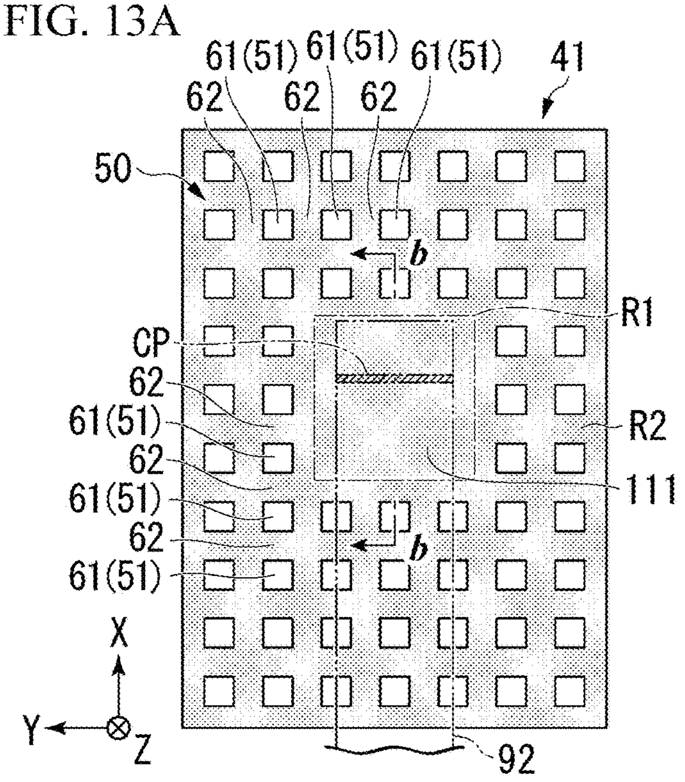
FIG. 13A is a plan view showing a terminal of the semiconductor storage device according to a first modified example of the first embodiment.
Figure 13B:
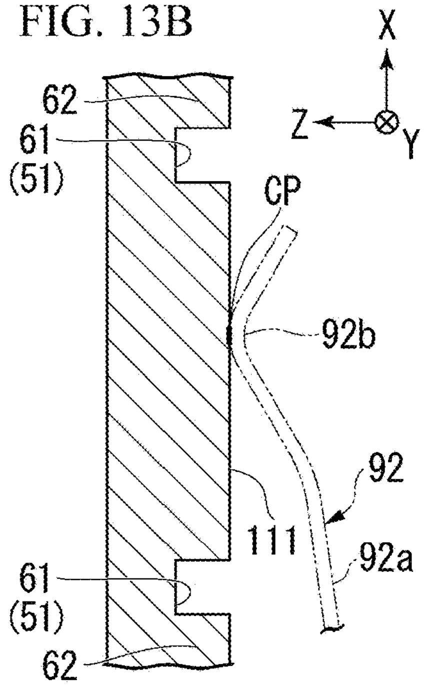
FIG. 13B is a view showing a terminal of the semiconductor storage device according to the first modified example of the first embodiment, and is a cross-sectional view taken along line b-b shown in FIG. 13A.

FIGS. 13A and 13B are views showing a terminal 41 of the first modified example of the first embodiment. In the present modified example, the terminal 41 has a first region R1 and a second region R2.

The first region R1 is a region in which at least a part thereof overlaps the curved portion 92*b* of the contact pin 92 when viewed from the Z direction. A width of the first region R1 in the Y direction is larger than the width of the curved portion 92*b* of the contact pin 92 in the Y direction.

The second region R2 is a region of the terminal 41 outside the first region R1. For example, the second region R2 is a region that does not overlap the curved portion 92*b* of the contact pin 92 compared to the first region R1 when viewed from the Z direction. The second region R2 is a region positioned between the first region R1 and ends of the terminal 41 in the X direction and the Y direction. The second region R2 is, for example, a frame-shaped region surrounding the first region R1.

In the present modified example, the second region R2 has the non-planar portion 50 described above. That is, the second region R2 has an uneven structure in which the recessed portions 61 and the protruding portions 62 are alternately aligned due to provision of the plurality of recesses 51.

On the other hand, the first region R1 does not have the non-planar portion 50. The first region R1 has the planar portion 111 that is flatter than the non-planar portion 50. The planar portion 111 has a flat surface extending in the X direction and the Y direction. In the present embodiment, the planar portion 111 is provided, for example, over the entire region of the first region R1. A width of the planar portion 111 in the Y direction is larger than the width of the protruding portion 62 in the Y direction. The width of the planar portion 111 in the Y direction is larger than the width of the curved portion 92*b* of the contact pin 92 in the Y direction. A width in the Y direction of the contact portion CP between the terminal 41 and the contact pin 92 coincides with the width in the Y direction of the curved portion 92*b* of the contact pin 92.

According to such a configuration, the contact portion CP between the terminal 41 and the contact pin 92 can be made larger than that in the first embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Second Modified Example of the First Embodiment

Next, a second modified example of the first embodiment will be described. The second modified example differs from the first modified example in that a non-planar portion 120 is provided in a region of the terminal 41 that overlaps the curved portion 92*b* of the contact pin 92. Note that, configurations other than those described below are the same as the configurations of the first embodiment.

Figure 14A:
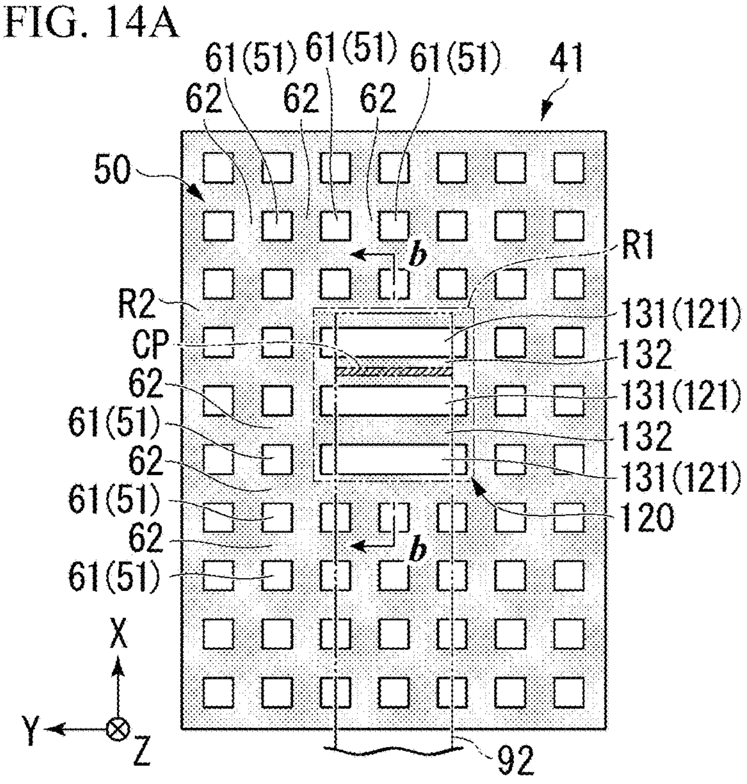
FIG. 14A is a plan view showing a terminal of the semiconductor storage device according to a second modified example of the first embodiment.
Figure 14B:
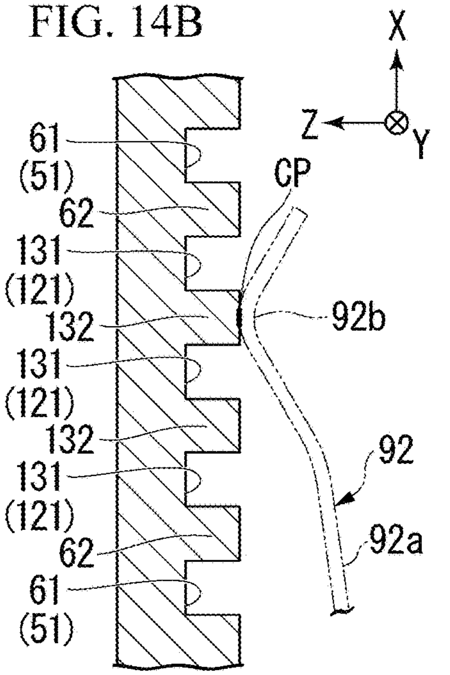
FIG. 14B is a view showing a terminal of the semiconductor storage device according to the second modified example of the first embodiment, and is a cross-sectional view taken along line b-b shown in FIG. 14A.

FIGS. 14 and 14B are views showing a terminal 41 of the second modified example of the first embodiment. In the present modified example, the terminal 41 has a first region R1 and a second region R2. The second region R2 has the non-planar portion 50 described above. That is, the second region R2 has an uneven structure in which the recessed portions 61 and the protruding portions 62 are alternately aligned due to provision of the plurality of recesses 51. On the other hand, the first region R1 has the non-planar portion 120. The non-planar portion 120 is an example of a "second non-planar portion".

In the present modified example, the non-planar portion 120 has a plurality of recesses 121. In the example shown in FIGS. 14 and 14B, three recesses 121 are disposed to be aligned in the X direction. When viewed from the Z direction, each of the recesses 121 has a rectangular shape that extends linearly in the Y direction. A width of the recess 121 in the Y direction is larger than the width of the recess 121 in the X direction. The recess 121 is a bottomed hole provided in a surface of the terminal 41. In the present modified example, the plurality of recesses 121 are provided, and thus the first region R1 has an uneven structure in which recessed portions 131 and protruding portions 132 are alternately aligned on the first region R1. The recessed portions 131 and the protruding portions 132 are aligned alternately in the X direction. The recessed portion 131 is an example of a "second recessed portion". The protruding portion 132 is an example of a "second protruding portion".

(Shape of Recessed Portion)

The recessed portion 131 is formed by the recess 121. In other words, the "recessed portion 131" may be read as the "recess 121". The plurality of recessed portions 131 are disposed at regular intervals in the X direction. A width of the recessed portion 131 in the X direction is for example, the same as a width of the recessed portion 61 in the X direction. A width of the recessed portion 131 in the Y direction is, for example, larger than the width of the recessed portion 61 in the Y direction. The width of the recessed portion 131 in the Y direction is, for example, larger than the width of the recessed portion 131 in the X direction. The recessed portion 131 extends linearly in the Y direction. The width of the recessed portion 131 in the Y direction is larger than the width of the curved portion 92*b* of the contact pin 92 in the Y direction.

(Shape of Protruding Portion)

The protruding portion 132 is a portion defined between two recessed portions 131 adjacent to each other due to provision of the plurality of recessed portions 131. In the present modified example, the protruding portion 132 is defined between two recessed portions 131 adjacent to each other in the X direction. A width of the protruding portion 132 in the X direction is for example, the same as a width of the protruding portion 62 in the X direction. A width of the protruding portion 132 in the Y direction is, for example, larger than the width of the protruding portion 62 in the Y direction. The width of the protruding portion 132 in the Y direction is larger than the width of the protruding portion 132 in the X direction. The protruding portion 132 extends linearly in the Y direction. The width of the protruding portion 132 in the Y direction is larger than the width of the curved portion 92*b* of the contact pin 92 in the Y direction. In the present modified example, the curved portion 92*b* of the contact pin 92 comes into contact with the protruding portion 132 of the terminal 41. A width in the Y direction of the contact portion CP between the terminal 41 and the contact pin 92 coincides with the width in the Y direction of the curved portion 92*b* of the contact pin 92.

According to such an aspect, the contact portion CP between the terminal 41 and the contact pin 92 can be made larger compared to that in the first embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Note that, in the second modified example, a part of the curved portion 92*b* of the contact pin 92 may enter the recessed portion 131. In the following, an aspect in which a part of the curved portion 92*b* of the contact pin 92 enters the recessed portion 131 will be described.

Figure 15A:
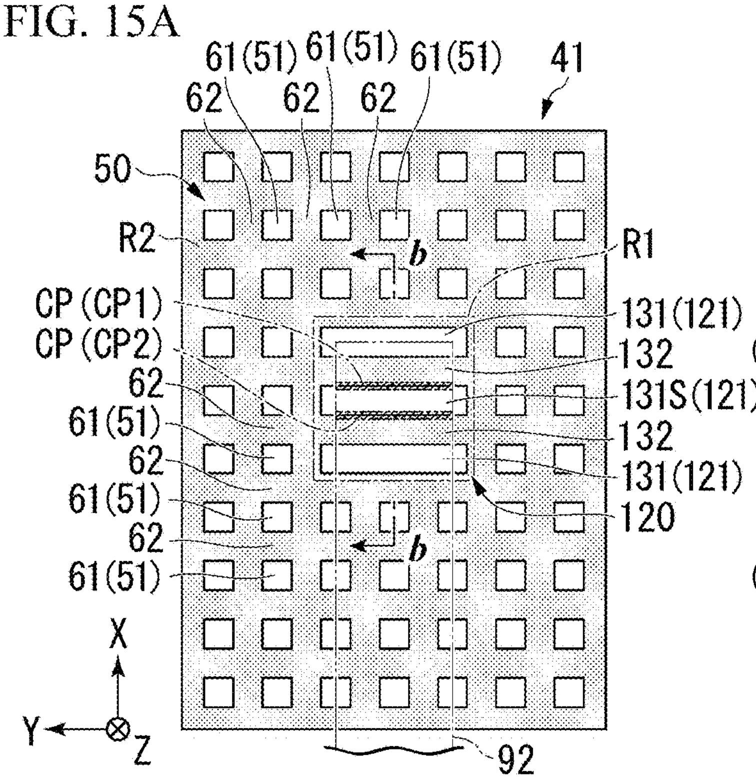
FIG. 15A is a plan view showing the terminal of the semiconductor storage device according to the second modified example of the first embodiment.
Figure 15B:
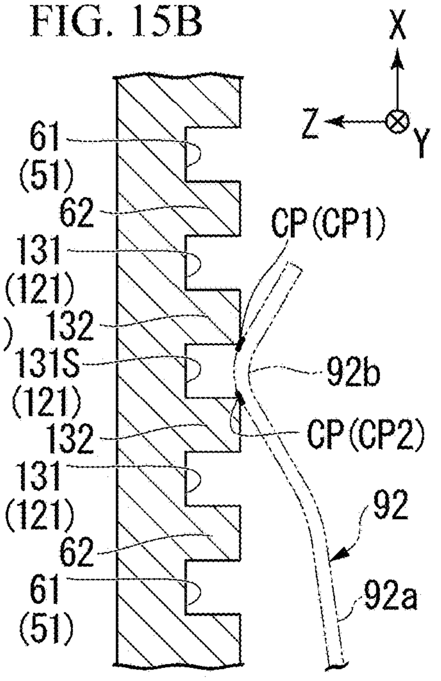
FIG. 15B is a view showing the terminal of the semiconductor storage device according to the second modified example of the first embodiment, and is a cross-sectional view taken along line b-b shown in FIG. 15A.

FIGS. 15A and 15B are views showing the terminal 41 of the second modified example of the first embodiment. In the example shown in FIGS. 15A and 15B, in the present modified example, a part of the curved portion 92*b* of the contact pin 92 enters one of the recessed portions 131. Hereinafter, the recessed portion 131 into which a part of the curved portion 92*b* enters is referred to as a "recessed portion 131S". In this case, one contact portion CP (first contact portion CP1) is formed at a boundary portion between the recessed portion 131S and the protruding portion 132. The protruding portion 132 is adjacent to the recessed portion 131S on one side in the X direction. Also, another contact portion CP (second contact portion CP2) is formed at a boundary portion between the recessed portion 131S and the protruding portion 132. The protruding portion 132 is adjacent to the recessed portion 131S on the other side in the X direction.

According to such an aspect, the number of the contact portions CP between the terminal 41 and the contact pin 92 can be increased compared to that in the first embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Third Modified Example of First Embodiment

Next, a third modified example of the first embodiment will be described. The third modified example differs from the second modified example of the first embodiment in that an inclined portion 141 is provided on a circumferential edge of the recessed portion 131. Note that, configurations other than those described below are the same as the configurations of the second modified example of the first embodiment.

Figure 16A:
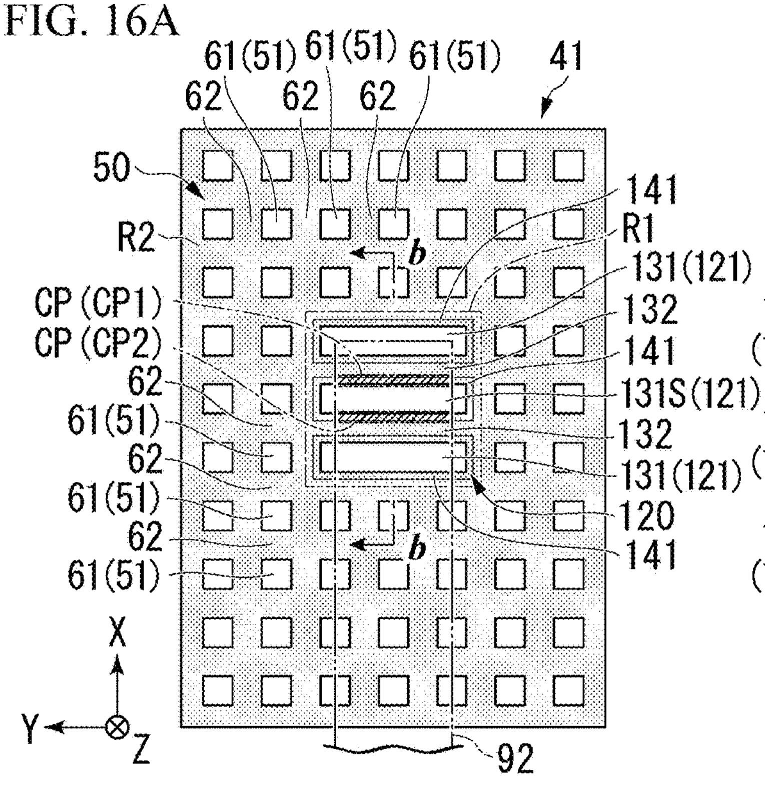
FIG. 16A is a plan view showing a terminal of the semiconductor storage device according to a third modified example of the first embodiment.
Figure 16B:
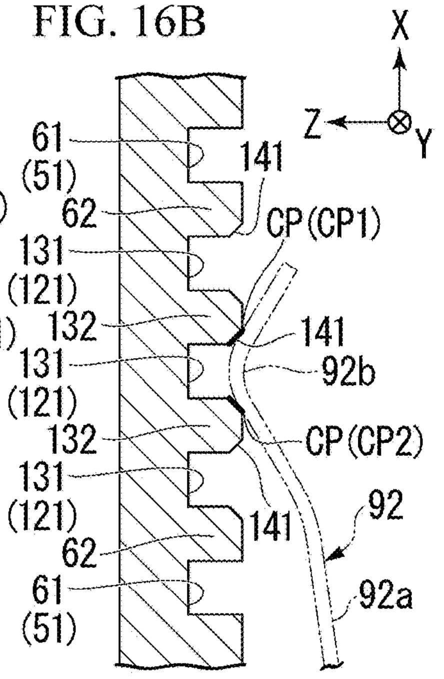
FIG. 16B is a view showing a terminal of the semiconductor storage device according to the third modified example of the first embodiment, and is a cross-sectional view taken along line b-b shown in FIG. 16A.

FIGS. 16A and 16B are views showing a terminal 41 of the third modified example of the first embodiment. In the present modified example, the terminal 41 has a first region R1 and a second region R2. The first region R1 has the non-planar portion 120 described above. That is, the first region R1 has an uneven structure in which the recessed portions 131 and the protruding portions 132 are alternately disposed due to provision of the plurality of recesses 121. On the other hand, the second region R2 has the non-planar portion 50 described above. That is, the second region R2 has an uneven structure in which the recessed portions 61 and the protruding portions 62 are alternately aligned due to provision of the plurality of recesses 51. A part of the curved portion 92*b* of the contact pin 92 enters one of the recessed portions 131 (recessed portion 131S).

In the present modified example, the inclined portion 141 is provided on the circumferential edge (for example, the entire circumferential edge) of the recessed portion 131. For example, the inclined portion 141 is provided in an annular shape along edges on both sides of the recessed portion 131 in the X direction and edges on both sides of the recessed portion 131 in the Y direction. From another perspective, the inclined portion 141 is provided on edges on both sides of the protruding portion 132 in the X direction. Note that, the inclined portion 141 need only be provided on one edge in the X direction of at least one protruding portion 132 that is to be in contact with the curved portion 92*b* of the contact pin 92. The inclined portion 141 is inclined with respect to the first surface 11*a* of the board 11. The inclined portion 141 is provided to round off corners of the protruding portion 132. The inclined portion 141 may be a planar inclined portion or a rounded inclined portion. The curved portion 92*b* of the contact pin 92 comes into contact with the inclined portion 141.

An example of a manufacturing method of the inclined portion 141 is as follows. Between the process of PART (h) and the process of PART (i) in FIG. 11, isotropic etching (dry etching or wet etching) is performed on the first plating layer 101. Therefore, the inclined portion is formed on the edge of the first plating layer 101. Thereafter, the second plating layer 102 and the third plating layer 103 are formed on the first plating layer 101 on which the inclined portion is formed by the processes described in the first embodiment. Therefore, the inclined portion 141 is formed on the circumferential edge (for example, the entire circumferential edge) of the recessed portion 131 to follow the inclined portion formed on the first plating layer 101.

According to such a configuration, a size of the contact portion CP between the terminal 41 and the contact pin 92 can be made larger compared to that in the first embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Second Embodiment

Next, a second embodiment will be described. The second embodiment differs from the first embodiment in that a plurality of protrusions 151 are provided instead of the plurality of recesses 51. Note that, configurations other than those described below are the same as the configurations of the first embodiment.

Figure 17:
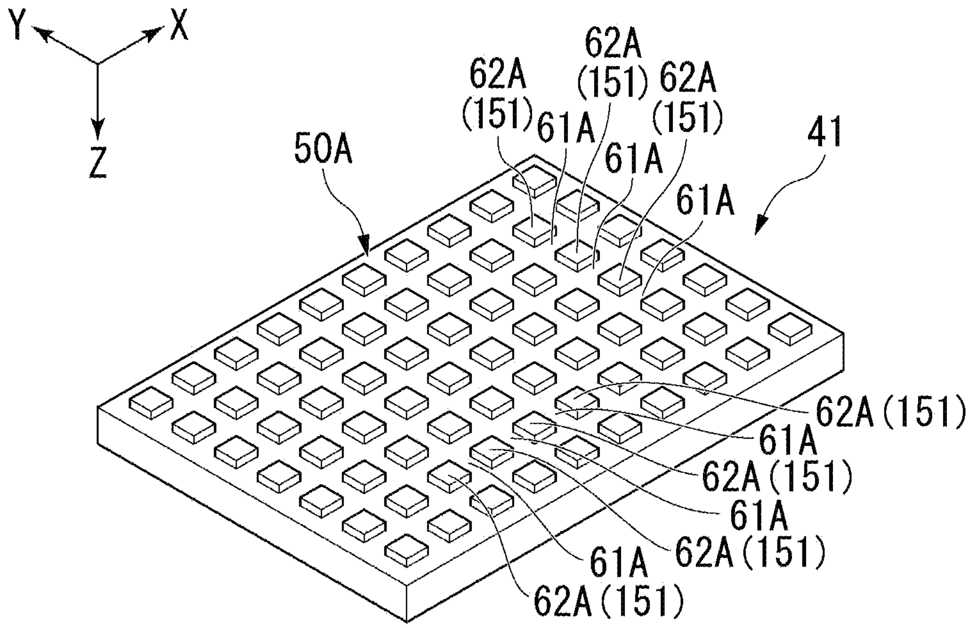
FIG. 17 is a perspective view showing a terminal of a semiconductor storage device according to a second embodiment.

FIG. 17 is a perspective view showing a terminal 41 of a semiconductor storage device 10 according to the second embodiment. As shown in FIG. 17, the terminal 41 has a non-planar portion 50A. The non-planar portion 50A is an example of a "first non-planar portion".

The non-planar portion 50A has the plurality of protrusions 151. Each of the protrusions 151 is a columnar protrusion protruding in the Z direction. For example, each protrusion 151 protrudes toward the outside of the semiconductor storage device 10. The plurality of protrusions 151 are disposed to be aligned in a matrix shape of, for example, ten rows in the X direction and seven rows in the Y direction. In the present embodiment, the non-planar portion 50A has an uneven structure in which recessed portions 61A and protruding portions 62A are alternately aligned due to provision of the plurality of protrusions 151. For example, the recessed portions 61A and the protruding portions 62A are aligned alternately in each of the X direction and the Y direction. The recessed portion 61A is an example of a "first recessed portion". The protruding portion 62A is an example of a "first protruding portion". Note that, the non-planar portion 50A does not need to be provided over the entire region of the terminal 41, and may be provided over only a partial region of the terminal 41.

(Shape of Protruding Portion)

Figure 18A:
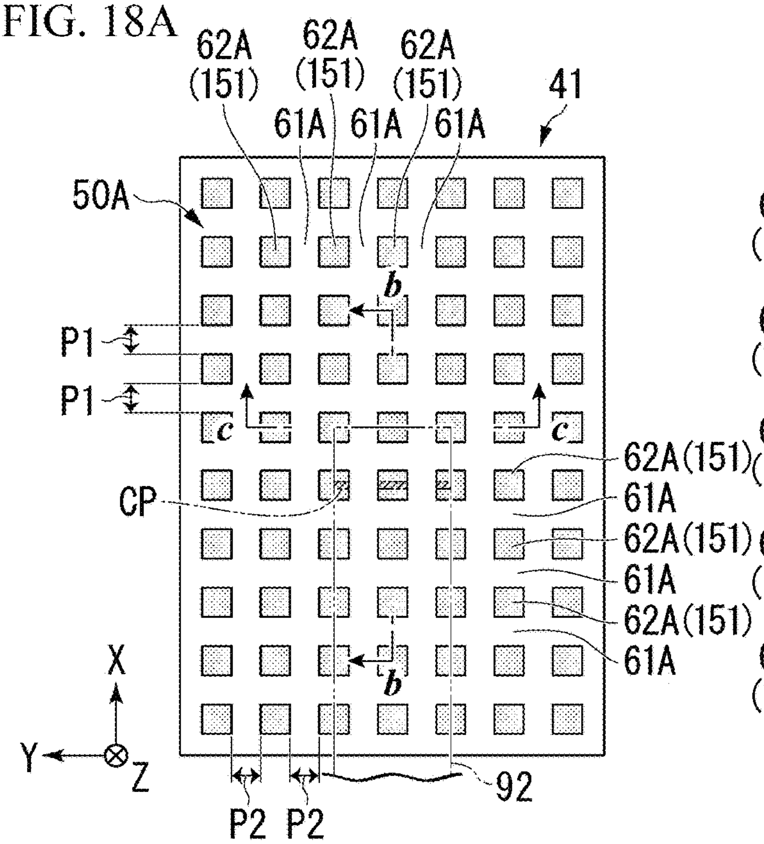
FIG. 18A is a plan view showing the terminal of the semiconductor storage device according to the second embodiment.
Figure 18B:
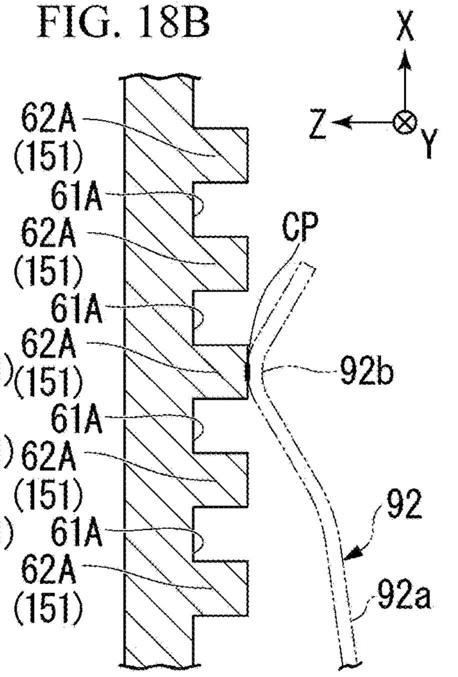
FIG. 18B is a view showing the terminal of the semiconductor storage device according to the second embodiment, and is a cross-sectional view taken along line b-b shown in FIG. 18A.
Figure 18C:
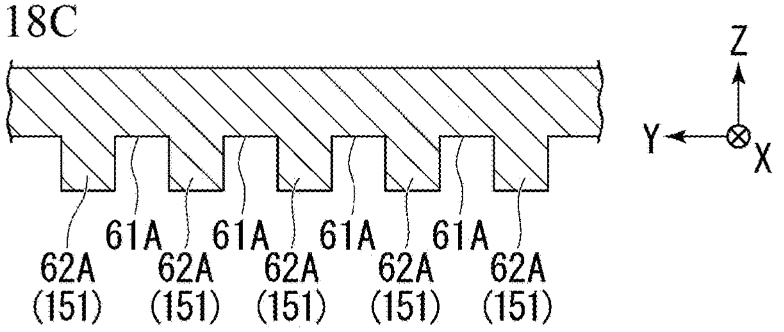
FIG. 18C is a view showing the terminal of the semiconductor storage device according to the second embodiment, and is a cross-sectional view taken along line c-c shown in FIG. 18A.

FIGS. 18A to 18C are views showing the terminal 41 of the semiconductor storage device 10 according to the second embodiment. The protruding portion 62A is formed by the protrusion 151. In other words, in the present embodiment, the "protruding portion 62A" may be read as the "protrusion 151". The plurality of protruding portions 62A are disposed at regular intervals at an interval P1 in the X direction. A width of the protruding portion 62A in the X direction is, for example, equal to or larger than the interval P1. Also, the plurality of protruding portions 62A are disposed at regular intervals at an interval P2 in the Y direction. A width of the protruding portion 62A in the Y direction is, for example, equal to or larger than the interval P2. The protruding portion 62A has a polygonal shape when viewed from the Z direction. For example, the protruding portion 62A has a quadrangular shape when viewed from the Z direction. However, the protruding portion 62A may have a triangular shape or a polygonal shape with five or more sides, may have a linear shape, or may have a circular shape. A height of the protruding portion 62A is, for example, 1 μm or more. In the present embodiment, the height of the protruding portion 62A is several micrometers to tens of micrometers. Each width in the X direction and the Y direction of the protruding portion 62A is, for example, 1 μm or more. In the present embodiment, each width in the X direction and the Y direction of the protruding portion 62A is several micrometers to hundreds of micrometers. In order to secure a rigidity of the protruding portion 62A for contact with a contact pin 92, it is preferable that an aspect ratio of the unevenness be 1 or less.

(Shape of Recessed Portion)

The recessed portion 61A is a portion defined between two protruding portions 62A adjacent to each other due to provision of the plurality of protruding portions 62A. In the present application, the term "recessed portion" means a portion that is recessed in a direction toward an insulating base 21 compared to a distal end surface of the protruding portion. In the present embodiment, the recessed portion 61A is defined between two protruding portions 62A adjacent to each other in the X direction or the Y direction.

The recessed portion 61A extends linearly, for example, in the X direction or the Y direction. For example, the plurality of recessed portions 61A include: nine recessed portions 61A that are spaced apart from each other in the X direction and extend in the Y direction; and six recessed portions 61A that are spaced apart from each other in the Y direction and extend in the X direction.

According to such a configuration, a surface area (heat dissipation area) of the terminal 41 can be increased by the recessed portions 61A and the protruding portions 62A aligned alternately. Therefore, an improvement in heat dissipation of the semiconductor storage device 10 can be achieved.

First Modified Example of Second Embodiment

Next, a first modified example of the second embodiment will be described. The first modified example differs from the second embodiment in that a planar portion 111 is provided in a region of the terminal 41 that overlaps a curved portion 92*b* of the contact pin 92. Note that, configurations other than those described below are the same as the configurations of the second embodiment.

Figure 19A:
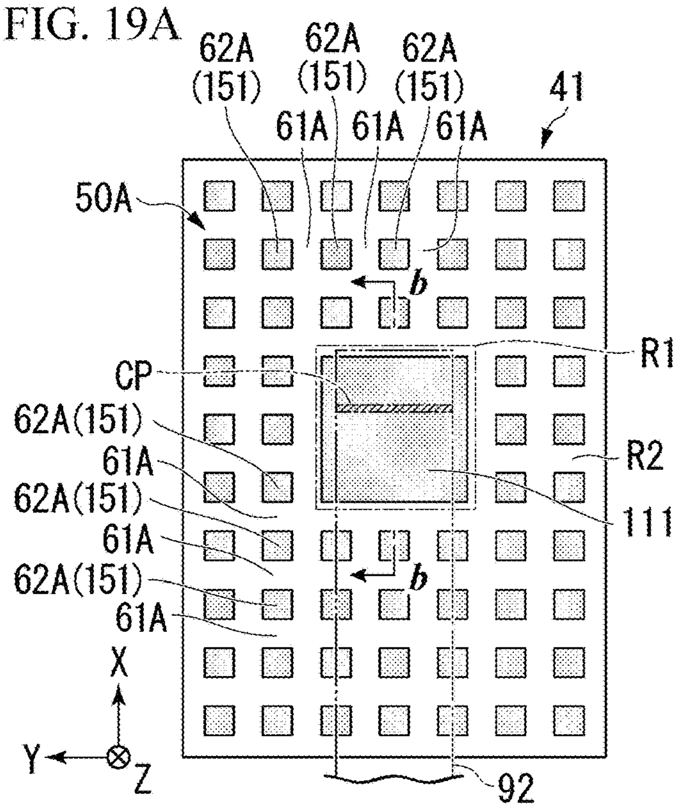
FIG. 19A is a plan view showing a terminal of the semiconductor storage device according to a first modified example of the second embodiment.
Figure 19B:
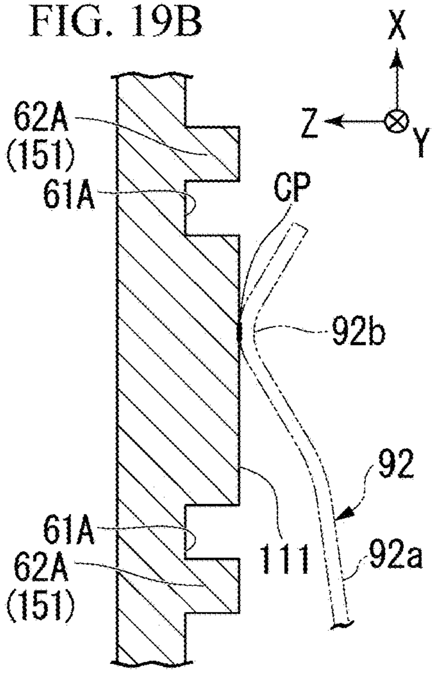
FIG. 19B is a view showing a terminal of the semiconductor storage device according to the first modified example of the second embodiment, and is a cross-sectional view taken along line b-b shown in FIG. 19A.

FIGS. 19A and 19B are views showing a terminal 41 of the first modified example of the second embodiment. In the present modified example, the terminal 41 has a first region R1 and a second region R2. The second region R2 has the non-planar portion 50A described above. That is, the second region R2 has an uneven structure in which the recessed portions 61A and the protruding portions 62A are alternately aligned due to provision of the plurality of protrusions 151.

On the other hand, the first region R1 does not have the non-planar portion 50A. The first region R1 has the planar portion 111 that is flatter than the non-planar portion 50A.

The planar portion 111 is provided, for example, over the entire region of the first region R1. A width of the planar portion 111 in the Y direction is larger than the width of the protruding portion 62A in the Y direction. The width of the planar portion 111 in the Y direction is larger than the width of the curved portion 92*b* of the contact pin 92 in the Y direction. A width in the Y direction of a contact portion CP between the terminal 41 and the contact pin 92 coincides with the width in the Y direction of the curved portion 92*b* of the contact pin 92.

According to such an aspect, the contact portion CP between the terminal 41 and the contact pin 92 can be made larger compared to that in the second embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Second Modified Example of Second Embodiment

Next, a second modified example of the second embodiment will be described. The second modified example differs from the second embodiment in that a non-planar portion 120A is provided in a region of the terminal 41 that overlaps the curved portion 92*b* of the contact pin 92. Note that, configurations other than those described below are the same as the configurations of the second embodiment.

Figure 20A:
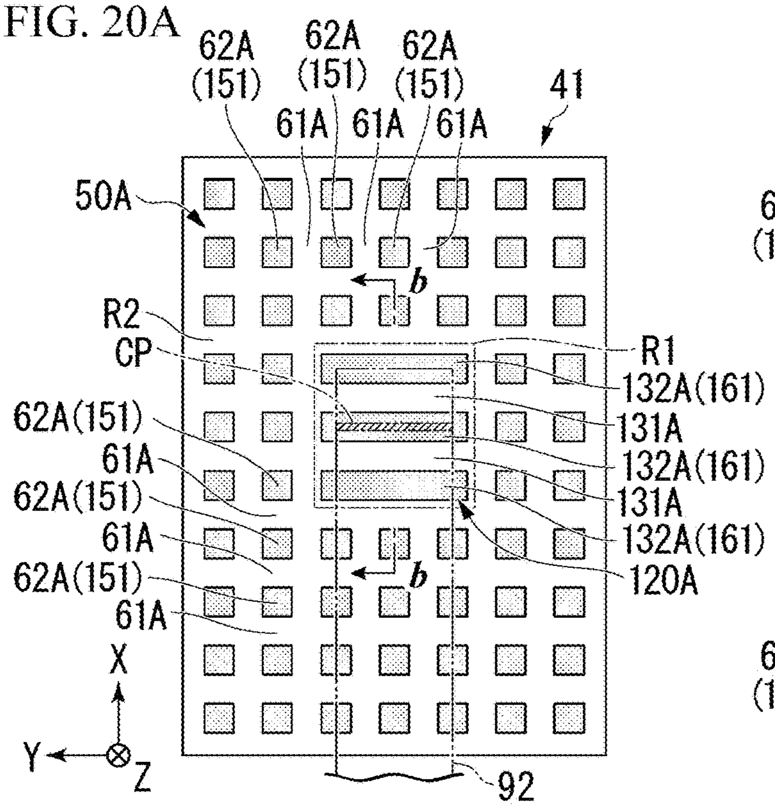
FIG. 20A is a plan view showing a terminal of the semiconductor storage device according to a second modified example of the second embodiment.
Figure 20B:
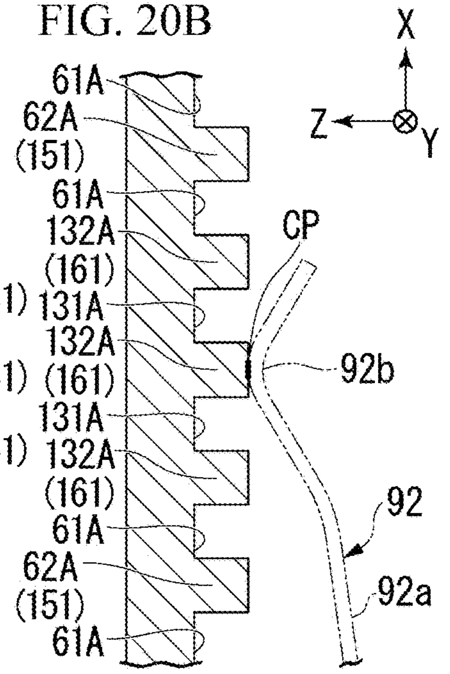
FIG. 20B is a view showing a terminal of the semiconductor storage device according to the second modified example of the second embodiment, and is a cross-sectional view taken along line b-b shown in FIG. 20A.

FIGS. 20A and 20B are views showing the terminal 41 of the second modified example of the second embodiment. In the present modified example, the terminal 41 has a first region R1 and a second region R2. The second region R2 has the non-planar portion 50A described above. That is, the second region R2 has an uneven structure in which the recessed portions 61A and the protruding portions 62A are alternately aligned due to provision of the plurality of protrusions 151. On the other hand, the first region R1 has the non-planar portion 120A. The non-planar portion 120A is an example of a "second non-planar portion".

In the present modified example, the non-planar portion 120A has a plurality of protrusions 161. In the example shown in FIGS. 20A and 20B, three protrusions 161 are disposed to be aligned in the X direction. When viewed from the Z direction, each of the protrusions 161 has a rectangular shape that extends linearly in the Y direction. A width of the protrusion 161 in the Y direction is larger than the width of the protrusion 151 in the Y direction. A protruding height of the protrusion 161 is the same as a protruding height of the protrusion 151. In the present modified example, the first region R1 has an uneven structure in which recessed portions 131A and protruding portions 132A are alternately aligned due to provision of the plurality of protrusions 161. The recessed portions 131A and the protruding portions 132A are aligned alternately in the X direction. The recessed portion 131A is an example of a "second recessed portion". The protruding portion 132A is an example of a "second protruding portion".

(Shape of Protruding Portion)

The protruding portion 132A is formed by the protrusion 161. In other words, the "protruding portion 132A" may be read as the "protrusion 161". The plurality of protruding portions 132A are disposed at regular intervals in the X direction. A width of the protruding portion 132A in the X direction is for example, the same as a width of the protruding portion 62A in the X direction. The width of the protruding portion 132A in the Y direction is, for example, larger than the width of the protruding portion 62A in the Y direction. The width of the protruding portion 132A in the Y direction is larger than the width of the protruding portion 132A in the X direction. The protruding portion 132A extends linearly in the Y direction. The width of the protruding portion 132A in the Y direction is larger than the width of the curved portion 92*b* of the contact pin 92 in the Y direction. In the present modified example, the curved portion 92*b* of the contact pin 92 comes into contact with the protruding portion 132A of the terminal 41. A width in the Y direction of the contact portion CP between the terminal 41 and the contact pin 92 coincides with the width in the Y direction of the curved portion 92*b* of the contact pin 92.

(Shape of Recessed Portion)

The recessed portion 131A is a portion defined between two protruding portions 132A adjacent to each other due to provision of the plurality of protruding portions 132A. In the present modified example, the recessed portion 131A is defined between two protruding portions 132A adjacent to each other in the X direction. A width of the recessed portion 131A in the X direction is for example, the same as a width of the recessed portion 61 in the X direction. A width of the recessed portion 131A in the Y direction is, for example, larger than the width of the recessed portion 61A in the Y direction. The width of the recessed portion 131A in the Y direction is larger than the width of the recessed portion 131A in the X direction. The recessed portion 131A extends linearly in the Y direction. The width of the recessed portion 131A in the Y direction is larger than the width of the curved portion 92*b* of the contact pin 92 in the Y direction.

According to such an aspect, the contact portion CP between the terminal 41 and the contact pin 92 can be made larger compared to that in the second embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Note that, in the second modified example, a part of the curved portion 92*b* of the contact pin 92 may enter the recessed portion 131A. In the following, an aspect in which a part of the curved portion 92*b* of the contact pin 92 enters the recessed portion 131A will be described.

Figure 21A:
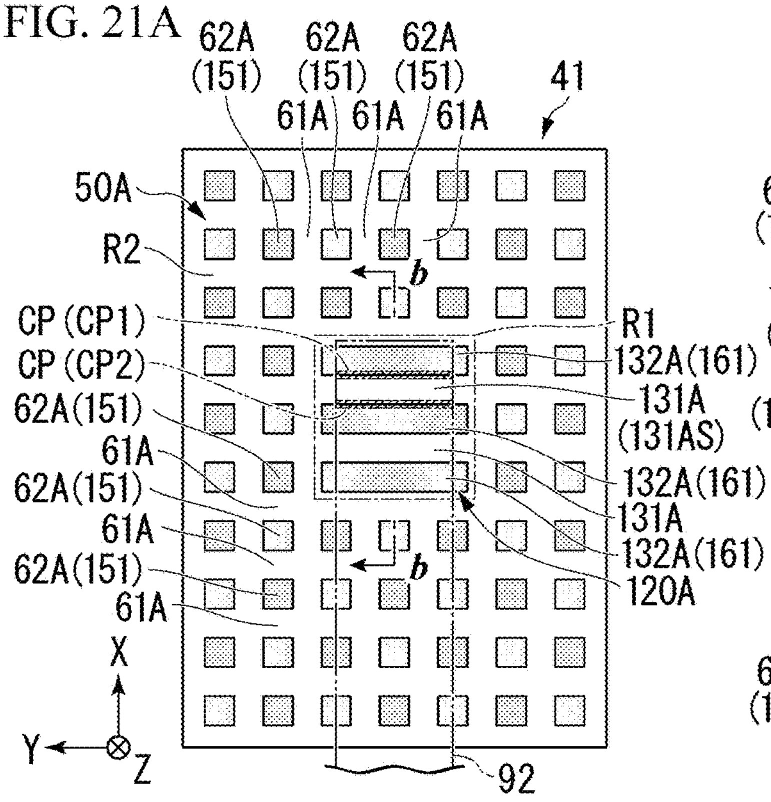
FIG. 21A is a plan view showing the terminal of the semiconductor storage device according to the second modified example of the second embodiment.
Figure 21B:
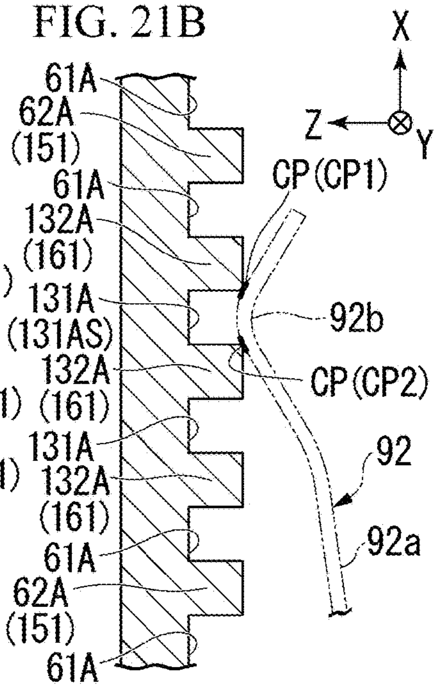
FIG. 21B is a view showing the terminal of the semiconductor storage device according to the second modified example of the second embodiment, and is a cross-sectional view taken along line b-b shown in FIG. 21A.

FIGS. 21A and 21B are views showing the terminal 41 of the second modified example of the second embodiment. In the example shown in FIGS. 21A and 21B, in the present modified example, a part of the curved portion 92*b* of the contact pin 92 enters one of the recessed portions 131A. Hereinafter, the recessed portion 131A into which a part of the curved portion 92*b* enters is referred to as a "recessed portion 131AS". In this case, one contact portion CP (first contact portion CP1) is formed at a boundary portion between the recessed portion 131AS and the protruding portion 132A adjacent to the recessed portion 131AS on one side in the X direction. Also, another contact portion CP (second contact portion CP2) is formed at a boundary portion between the recessed portion 131AS and the protruding portion 132A adjacent to the recessed portion 131AS on the other side in the X direction.

According to such an aspect, the number of the contact portions CP between the terminal 41 and the contact pin 92 can be increased compared to that in the second embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Third Modified Example of Second Embodiment

Next, a third modified example of the second embodiment will be described. The third modified example differs from the second embodiment in that an inclined portion 141 is provided on a circumferential edge of the protruding portion 62A (protrusion 151). Note that, configurations other than those described below are the same as the configurations of the second embodiment.

Figure 22A:
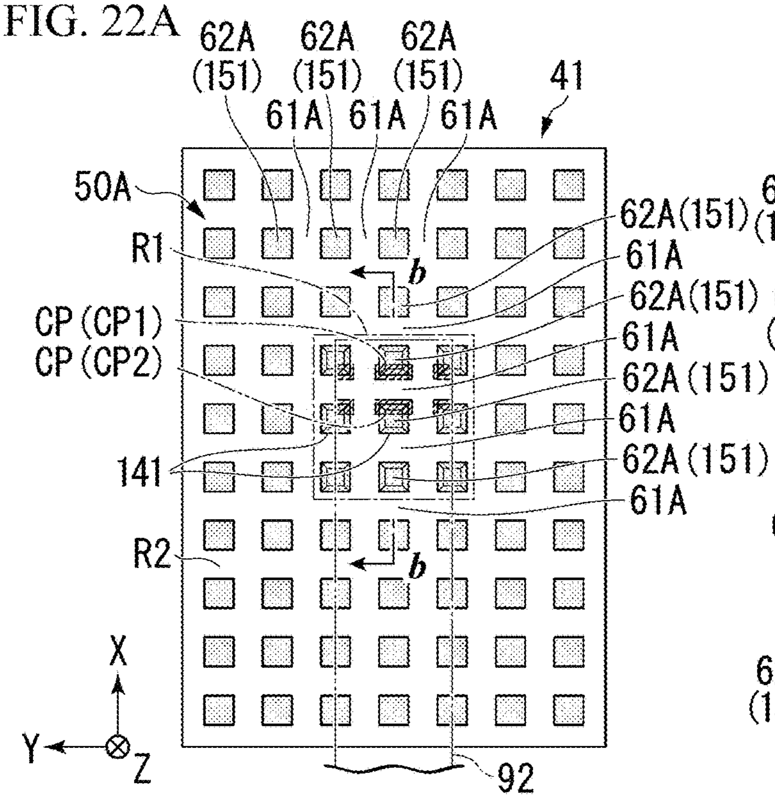
FIG. 22A is a plan view showing a terminal of the semiconductor storage device according to a third modified example of the second embodiment.
Figure 22B:
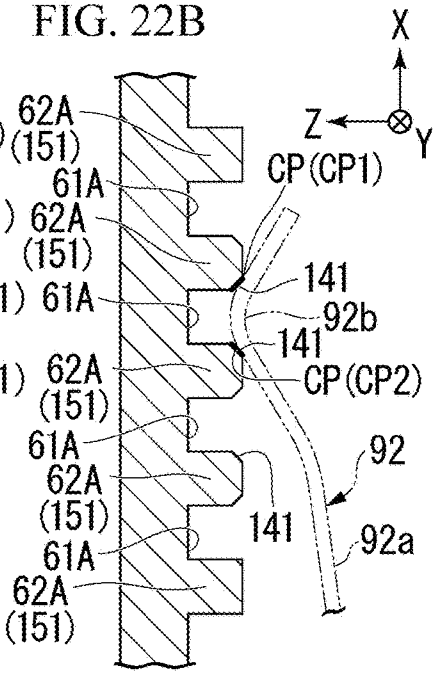
FIG. 22B is a view showing a terminal of the semiconductor storage device according to the third modified example of the second embodiment, and is a cross-sectional view taken along line b-b shown in FIG. 22A.

FIGS. 22A and 22B are views showing a terminal 41 of the third modified example of the second embodiment. In the present modified example, the terminal 41 has a first region R1 and a second region R2. In the present modified example, each of the first region R1 and the second region R2 has the non-planar portion 50A described above. That is, each of the first region R1 and the second region R2 has an uneven structure in which the recessed portions 61A and the protruding portions 62A are alternately aligned due to provision of the plurality of protrusions 151.

In the present modified example, the inclined portion 141 is provided on a circumferential edge (for example, the entire circumferential edge) of the protruding portion 62A (protrusion 151) provided in the first region R1. For example, the inclined portion 141 is provided in an annular shape along edges on both sides of the protruding portion 62A in the X direction and edges on both sides of the protruding portion 62A in the Y direction. Note that, the inclined portion 141 need only be provided on at least one edge in the X direction of the protruding portion 62A that is to be in contact with the curved portion 92*b* of the contact pin 92. The inclined portion 141 is inclined with respect to a first surface 11*a* of a board 11. The inclined portion 141 is provided to round off corners of the protruding portion 62A. The inclined portion 141 may be a planar inclined portion or a rounded inclined portion. The curved portion 92*b* of the contact pin 92 comes into contact with the inclined portion 141.

According to such a configuration, a size of the contact portion CP between the terminal 41 and the contact pin 92 can be made larger compared to that in the second embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Fourth Modified Example of Second Embodiment

Next, a fourth modified example of the second embodiment will be described. The fourth modified example differs from the second embodiment in that the inclined portion 141 is provided on a circumferential edge of the protruding portion 132A (protrusion 161). Note that, configurations other than those described below are the same as the configurations of the second embodiment.

Figure 23A:
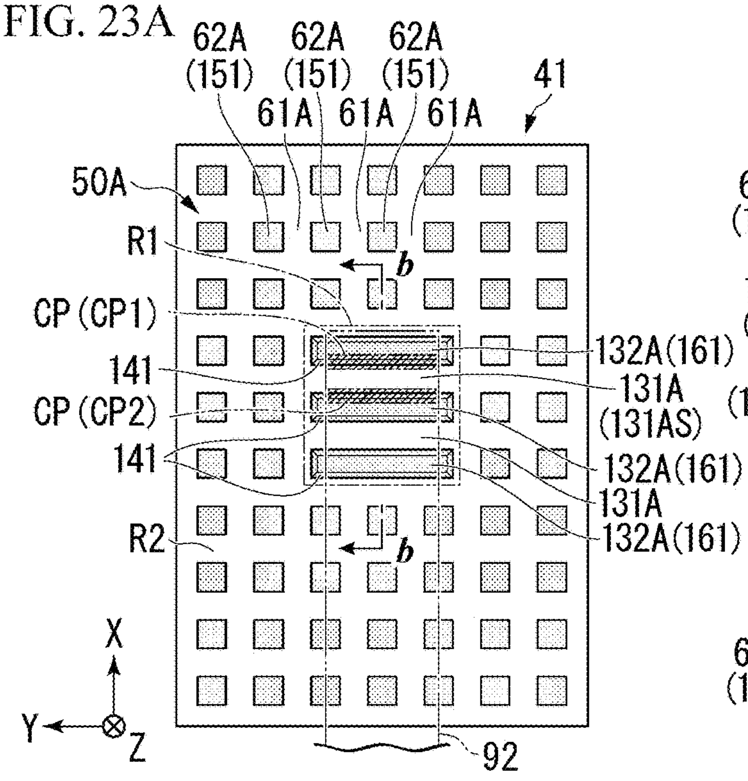
FIG. 23A is a plan view showing a terminal of the semiconductor storage device according to a fourth modified example of the second embodiment.
Figure 23B:
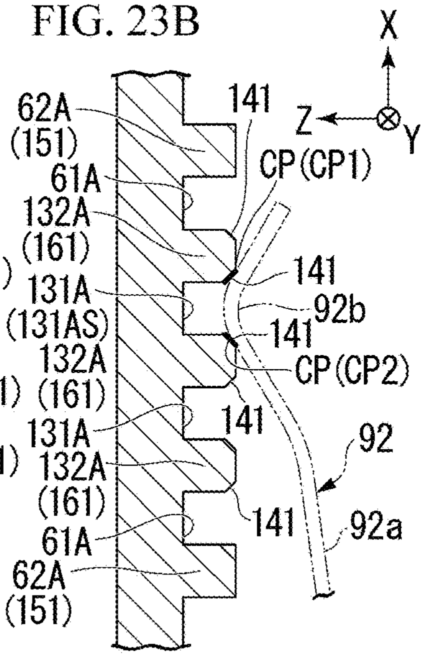
FIG. 23B is a view showing a terminal of the semiconductor storage device according to the fourth modified example of the second embodiment, and is a cross-sectional view taken along line b-b shown in FIG. 23A.

FIGS. 23A and 23B are views showing a terminal 41 of the fourth modified example of the second embodiment. In the present modified example, the terminal 41 has a first region R1 and a second region R2. In the present modified example, the first region R1 has the non-planar portion 120A described above. That is, the first region R1 has an uneven structure in which the recessed portions 131A and the protruding portions 132A are alternately aligned due to provision of the plurality of protrusions 161. On the other hand, the second region R2 has the non-planar portion 50A described above. That is, the second region R2 has an uneven structure in which the recessed portions 61A and the protruding portions 62A are alternately aligned due to provision of the plurality of protrusions 151.

In the present modified example, the inclined portion 141 is provided on a circumferential edge (for example, the entire circumferential edge) of the protruding portion 132A (protrusion 161) provided in the first region R1. For example, the inclined portion 141 is provided in an annular shape along edges on both sides of the protruding portion 132A in the X direction and edges on both sides of the protruding portion 132A in the Y direction. Note that, the inclined portion 141 need only be provided on one edge in the X direction of at least one protruding portion 132A that is to be in contact with the curved portion 92*b* of the contact pin 92. The inclined portion 141 is inclined with respect to the first surface 11*a* of the board 11. The inclined portion 141 is provided to round off corners of the protruding portion 132A. The inclined portion 141 may be a planar inclined portion or a rounded inclined portion. The curved portion 92*b* of the contact pin 92 comes into contact with the inclined portion 141.

According to such a configuration, a size of the contact portion CP between the terminal 41 and the contact pin 92 can be made larger compared to that in the second embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Fifth Modified Example of Second Embodiment

Next, a fifth modified example of the second embodiment will be described. The fifth modified example differs from the second embodiment in that a non-planar portion 170 is provided. Note that, configurations other than those described below are the same as the configurations of the second embodiment.

Figure 24:
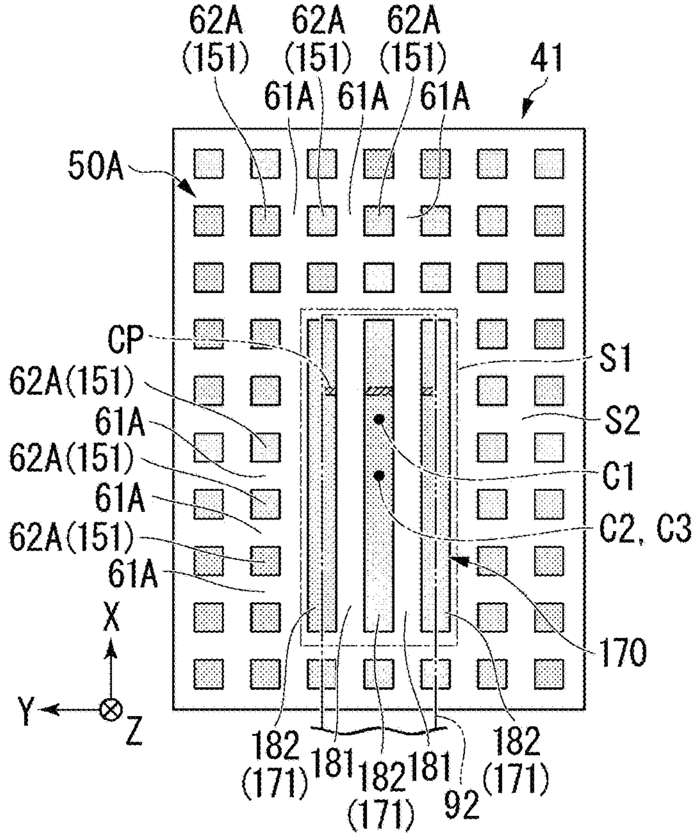
FIG. 24 is a view showing a terminal of the semiconductor storage device according to a fifth modified example of the second embodiment.

FIG. 24 is a view showing a terminal 41 of the fifth modified example of the second embodiment. In the present modified example, the terminal 41 has a first region S1 and a second region S2.

The first region S1 is a region in which at least a part thereof overlaps the curved portion 92*b* of the contact pin 92 when viewed from the Z direction. A width of the first region S1 in the Y direction is larger than the width of the curved portion 92*b* of the contact pin 92 in the Y direction. A width of the first region S1 in the X direction is larger than the width of the first region S1 in the Y direction. The width of the first region S1 in the X direction is, for example, a half or more of a width of the terminal 41 in the X direction. A center C2 in the X direction of the first region S1 is positioned so as to be displaced to one side in the X direction from a center C1 in the X direction of the terminal 41. The one side described above is a side on which the contact pin 92 comes closer to the terminal 41 when the contact pin 92 comes into contact with the terminal 41.

The second region S2 is a region of the terminal 41 outside the first region S1. For example, the second region S2 is a region that does not overlap the curved portion 92*b* of the contact pin 92 compared to the first region S1 when viewed from the Z direction. The second region S2 is a region positioned between the first region S1 and ends of the terminal 41 in the X direction and the Y direction. For example, the second region S2 is a frame-shaped region surrounding the first region S1.

In the present modified example, the second region S2 has the non-planar portion 50A described above. That is, the second region S2 has an uneven structure in which the recessed portions 61A and the protruding portions 62A are alternately aligned due to provision of the plurality of protrusions 151. On the other hand, the first region S1 has the non-planar portion 170. The non-planar portion 170 is an example of a "second non-planar portion".

In the present modified example, the non-planar portion 170 has a plurality of protrusions 171. In the example shown in FIG. 24, three protrusions 171 are disposed to be aligned in the Y direction. When viewed from the Z direction, each of the protrusions 171 has a rectangular shape that extends linearly in the X direction. A width of the protrusion 171 in the X direction is larger than the width of the protrusion 151 in the X direction. A protruding height of the protrusion 171 is the same as a protruding height of the protrusion 151. In the present modified example, the first region S1 has an uneven structure in which recessed portions 181 and protruding portions 182 are alternately aligned due to provision of the plurality of protrusions 171. The recessed portions 181 and the protruding portions 182 are aligned alternately in the X direction. The recessed portion 181 is an example of a "second recessed portion". The protruding portion 182 is an example of a "second protruding portion".

(Shape of Protruding Portion)

The protruding portion 182 is formed by the protrusion 171. In other words, the "protruding portion 182" may be read as the "protrusion portion 171". The plurality of protruding portions 182 are disposed at regular intervals in the Y direction. A width of the protruding portion 182 in the Y direction is, for example, the same as a width of the protruding portion 62A in the Y direction. A width of the protruding portion 182 in the X direction is, for example, larger than the width of the protruding portion 62A in the X direction. The width of the protruding portion 182 in the X direction is, for example, larger than the width of the protruding portion 182 in the Y direction. The protruding portion 182 extends linearly in the X direction. The width of the protruding portion 182 in the X direction is, for example, a half or more of a width of the terminal 41 in the X direction. A center C3 in the X direction of the protruding portion 182 is positioned so as to be displaced to one side in the X direction from the center C1 in the X direction of the terminal 41. The one side described above is a side on which the contact pin 92 comes closer to the terminal 41 when the contact pin 92 comes into contact with the terminal 41.

The width of the protruding portion 182 in the Y direction is smaller than the width of the curved portion 92*b* of the contact pin 92 in the Y direction. In the present modified example, the curved portion 92*b* of the contact pin 92 comes into contact with the protruding portion 182 of the terminal 41. When the terminal 41 and the contact pin 92 comes into contact with each other, the contact pin 92 is movable on the protruding portion 182 in the X direction along a surface of the protruding portion 182.

(Shape of Recessed Portion)

The recessed portion 181 is a portion defined between two protruding portions 182 adjacent to each other due to provision of the plurality of protruding portions 182. In the present modified example, the recessed portion 181 is defined between two protruding portions 182 adjacent to each other in the Y direction. A width of the recessed portion 181 in the Y direction is the same as a width of the recessed portion 61A in the Y direction. The recessed portion 181 extends linearly in the X direction. A width of the recessed portion 181 in the X direction is, for example, larger than the width of the recessed portion 61A in the X direction.

According to such a configuration, a rigidity of the protruding portion 182 can be enhanced against a frictional force in the X direction that occurs when the protruding portion 182 comes into contact with the contact pin 92. Collapsing of the protruding portion 182 can be suppressed when it comes into contact with the contact pin 92. Therefore, it is easier to suppress occurrence of electrical problems related to the terminal 41.

Sixth Modified Example of Second Embodiment

Next, a sixth modified example of the second embodiment will be described. The sixth modified example differs from the second embodiment in that the first region S1 has a non-planar portion 50. Note that, configurations other than those described below are the same as the configurations of the second embodiment.

Figure 25:
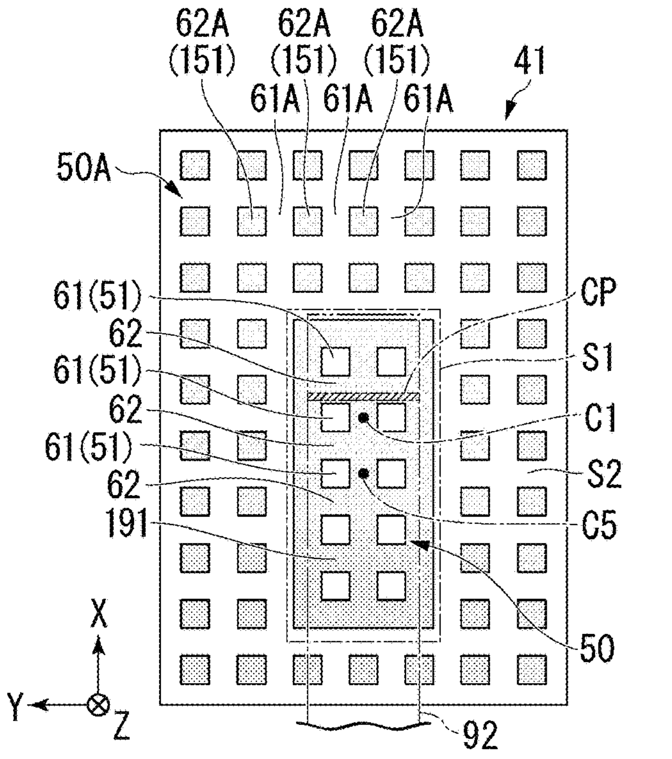
FIG. 25 is a view showing a terminal of the semiconductor storage device according to a sixth modified example of the second embodiment.

FIG. 25 is a view showing a terminal 41 of the sixth modified example of the second embodiment. In the present modified example, the terminal 41 has the first region S1 and the second region S2. The second region S2 has the non-planar portion 50A described above. That is, the second region S2 has an uneven structure in which the recessed portions 61A and the protruding portions 62A are alternately aligned due to provision of the plurality of protrusions 151. In the present modified example, the non-planar portion 50A is an example of a "first non-planar portion".

On the other hand, the first region S1 has a protrusion 191 and the non-planar portion 50 provided on the protrusion 191. A protruding height of the protrusion 191 is the same as a protruding height of the protrusion 151. A width of the protrusion 191 in the Y direction is larger than the width of the protrusion 151 in the Y direction. The width of the protrusion 191 in the Y direction is, for example, larger than the width of the curved portion 92*b* of the contact pin 92 in the Y direction.

A width of the protrusion 191 in the X direction is, for example, larger than the width of the protrusion 191 in the Y direction. The width of the protrusion 191 in the X direction is, for example, a half or more of a width of the terminal 41 in the X direction. A center C5 of the protrusion 191 in the X direction is positioned so as to be displaced to one side in the X direction from the center C1 of the terminal 41 in the X direction. The one side described above is a side on which the contact pin 92 comes closer to the terminal 41 when the contact pin 92 comes into contact with the terminal 41.

The non-planar portion 50 is provided on a surface of the protrusion 191. That is, the protrusion 191 has an uneven structure in which the recessed portions 61 and the protruding portions 62 are alternately aligned due to provision of the plurality of recesses 51. In the present modified example, the non-planar portion 50 is an example of a "second non-planar portion".

According to such a configuration, a rigidity of the protrusion 191 can be enhanced against a frictional force in the X direction that occurs when the protrusion 191 comes into contact with the contact pin 92. Collapsing of the protrusion 191 can be suppressed when it comes into contact with the contact pin 92. Therefore, it is easier to suppress occurrence of electrical problems related to the terminal 41.

Seventh Modified Example of Second Embodiment

Next, a seventh modified example of the second embodiment will be described. The seventh modified example differs from the sixth modified example of the second embodiment in that the recessed portion 61 provided in the protrusion 191 extends linearly in the X direction. Note that, configurations other than those described below are the same as the configurations of the sixth modified example of the second embodiment.

Figure 26:
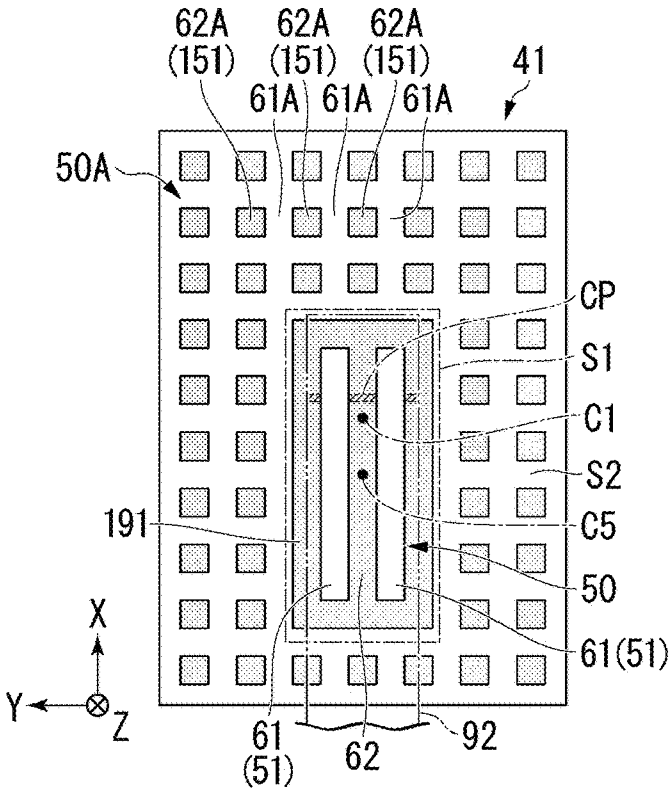
FIG. 26 is a view showing a terminal of the semiconductor storage device according to a seventh modified example of the second embodiment.

FIG. 26 is a view showing a terminal 41 of the seventh modified example of the second embodiment. In the present modified example, the terminal 41 has the protrusion 191 and the non-planar portion 50 provided on the protrusion 191. The recessed portion 61 and the protruding portion 62 included in the non-planar portion 50 extend linearly in the Y direction. A width in the X direction of each of the recessed portion 61 and the protruding portion 62 is, for example, a half or more of a width in the X direction of the terminal 41.

According to such a configuration, a rigidity of the protrusion 191 can be enhanced against a frictional force in the X direction that occurs when the protruding portion 192 comes into contact with the contact pin 92. Collapsing of the protrusion 191 can be suppressed when it comes into contact with the contact pin 92. Therefore, it is easier to suppress occurrence of electrical problems related to the terminal 41.

Eighth Modified Example of Second Embodiment

Next, an eighth modified example of the second embodiment will be described. The eighth modified example differs from the second embodiment in that the first region R1 has a protrusion 200. Note that, configurations other than those described below are the same as the configurations of the second embodiment.

Figure 27A:
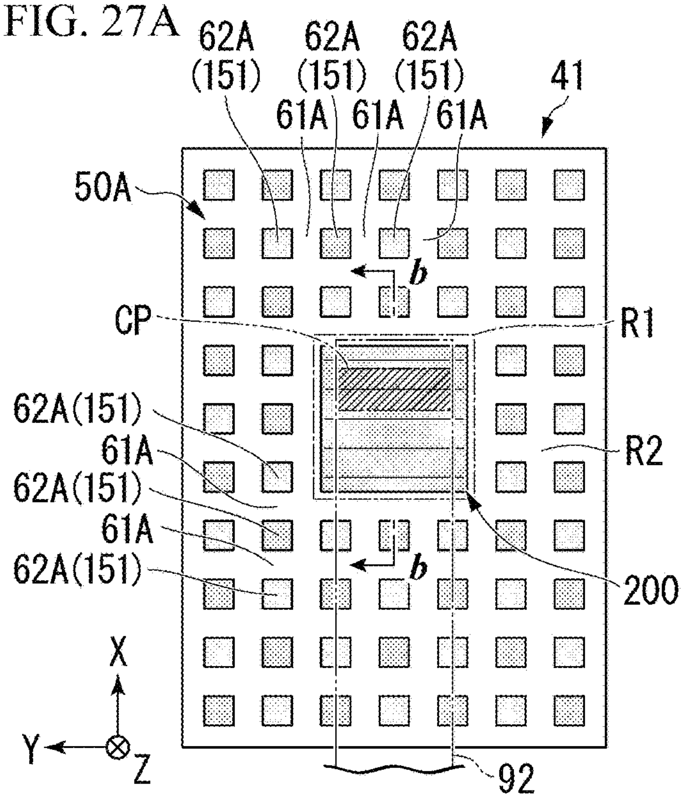
FIG. 27A is a plan view showing a terminal of the semiconductor storage device according to an eighth modified example of the second embodiment.
Figure 27B:
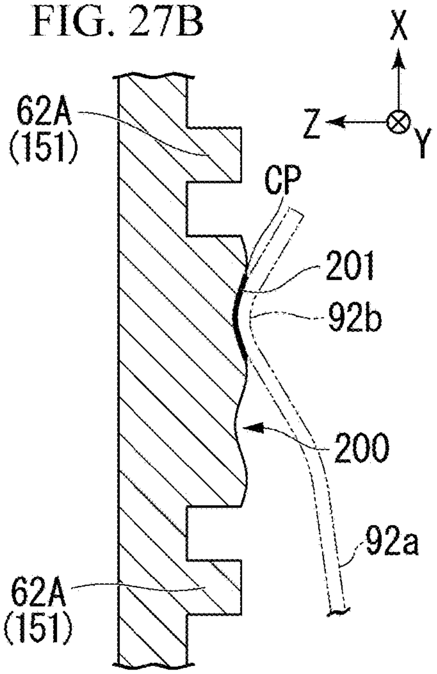
FIG. 27B is a view showing a terminal of the semiconductor storage device according to an eighth modified example of the second embodiment, and is a cross-sectional view taken along line b-b shown in FIG. 27A.

FIGS. 27A and 27B are views showing a terminal 41 of the eighth modified example of the second embodiment. In the present modified example, the terminal 41 has the first region R1 and the second region R2. The second region R2 has the non-planar portion 50A described above. That is, the second region R2 has an uneven structure in which the recessed portions 61A and the protruding portions 62A are alternately aligned due to provision of the plurality of protrusions 151.

On the other hand, the first region R1 has the protrusion 200. The protrusion 200 comes into contact with the curved portion 92*b* of the contact pin 92. The protrusion 200 is an example of a “receiving portion”. In the present embodiment, a surface of the protrusion 200 has a curved surface portion 201 that is curved in the same direction as the curved portion 92*b*. For example, the curved surface portion 201 has a wavy shape with the same curvature as the curved portion 92*b*. The contact portion CP between the terminal 41 and the contact pin 92 is formed along the curved surface portion 201.

According to such an aspect, the contact portion CP between the terminal 41 and the contact pin 92 can be made larger compared to that in the first embodiment. Therefore, heat is easily transferred from the terminal 41 to the contact pin 92. Therefore, further improvement in heat dissipation can be achieved. Also, a contact resistance between the terminal 41 and the contact pin 92 is reduced, and thereby further stabilization of the electrical connection between the terminal 41 and the contact pin 92 can be achieved.

Ninth Modified Example of Second Embodiment

Next, a ninth modified example of the second embodiment will be described. The ninth modified example differs from the second embodiment in that at least a part of the protruding portions 62A has a trapezoidal cross section. Note that, configurations other than those described below are the same as the configurations of the second embodiment.

Figure 28A:
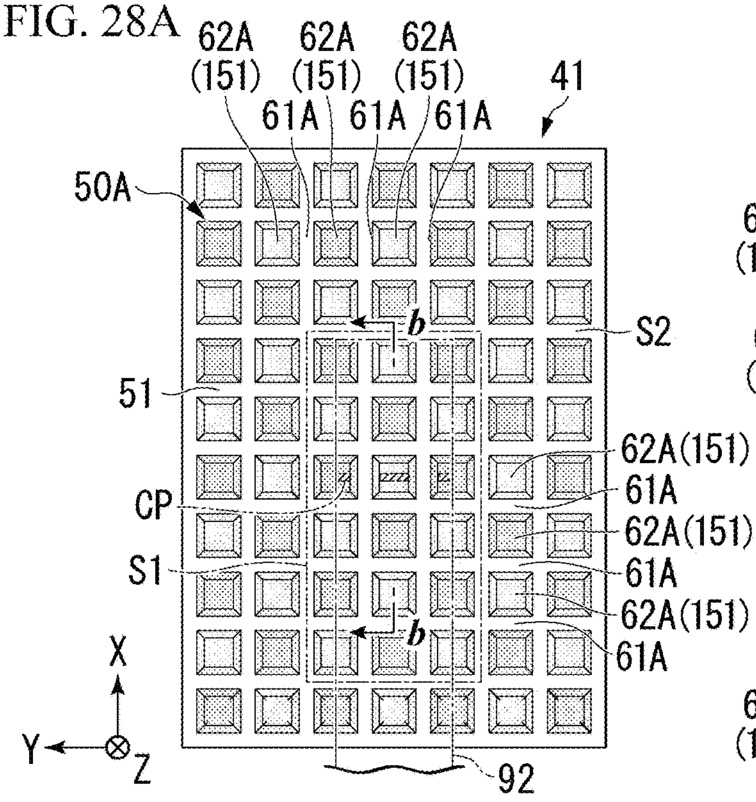
FIG. 28A is a plan view showing a terminal of the semiconductor storage device according to a ninth modified example of the second embodiment.
Figure 28B:
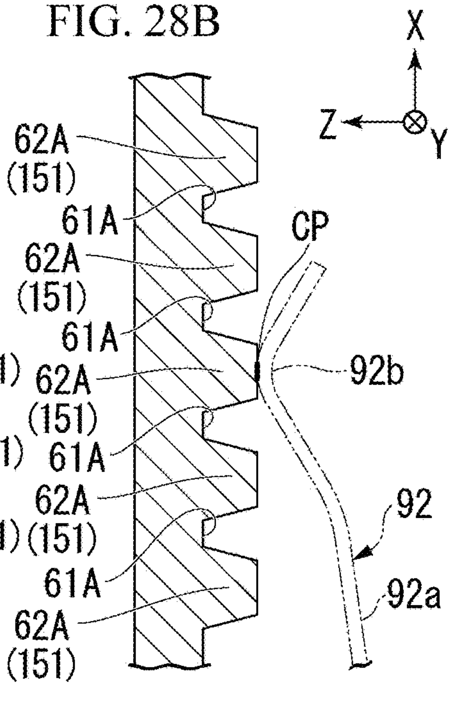
FIG. 28B is a view showing a terminal of the semiconductor storage device according to the ninth modified example of the second embodiment, and is a cross-sectional view taken along line b-b shown in FIG. 28A.

FIGS. 28A and 28B are views showing a terminal 41 of the ninth modified example of the second embodiment. In the present modified example, a cross section of the protruding portion 62A (protrusion 151) provided at least in the first region S1 is formed in a trapezoidal shape. That is, a width of the protruding portion 62A in at least one of the X direction and the Y direction gradually increases toward a main body portion 45.

According to such a configuration, a rigidity of the protruding portion 62A can be enhanced against a frictional force in the X direction that occurs when the protruding portion 62A comes into contact with the contact pin 92. Collapsing of the protruding portion 62A can be suppressed when it comes into contact with the contact pin 92. Therefore, it is easier to suppress occurrence of electrical problems related to the terminal 41.

Tenth Modified Example of Second Embodiment

Next, a tenth modified example of the second embodiment will be described. The tenth modified example differs from the second embodiment in that at least a part of the protruding portions 132A has a trapezoidal cross section. Note that, configurations other than those described below are the same as the configurations of the second embodiment.

Figure 29A:
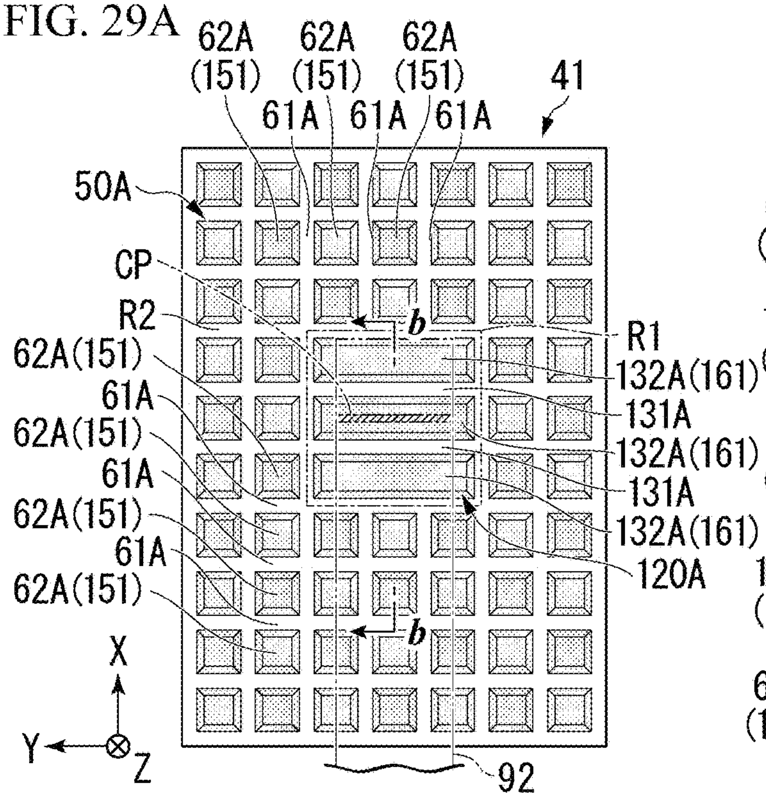
FIG. 29A is a plan view showing a terminal of the semiconductor storage device according to a tenth modified example of the second embodiment.
Figure 29B:
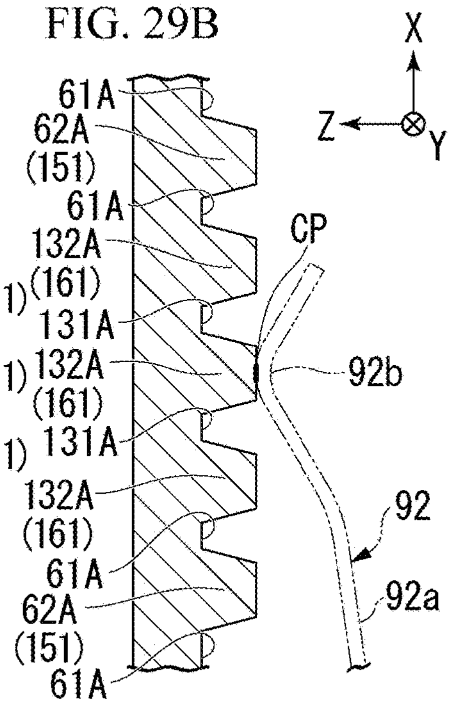
FIG. 29B is a view showing a terminal of the semiconductor storage device according to the tenth modified example of the second embodiment, and is a cross-sectional view taken along line b-b shown in FIG. 29A.

FIGS. 29A and 29B are views showing a terminal 41 according to a tenth modified example of the second embodiment. In the present modified example, at least a part of the protruding portion 132A (protrusion 161) has a trapezoidal cross section. That is, a width of the protruding portion 62A in at least one of the X direction and the Y direction gradually increases toward a main body portion 45.

According to such a configuration, a rigidity of the protruding portion 132A can be enhanced against a frictional force in the X direction that occurs when the protruding portion 132A comes into contact with the contact pin 92. Collapsing of the protruding portion 132A can be suppressed when it comes into contact with the contact pin 92. Therefore, it is easier to suppress occurrence of electrical problems related to the terminal 41.

Third Embodiment

Next, a third embodiment will be described. The third embodiment differs from the first embodiment or the second embodiment in that the solder resist layer 32 has a non-planar portion 310. Note that, configurations other than those described below are the same as the configurations of the first embodiment or the second embodiment. A terminal 41 of a semiconductor storage device 10 according to the third embodiment has a non-planar portion 50, 50A, 120, 120A, or 170 similar to any one of that in the first embodiment, the modified examples of the first embodiment, the second embodiment, and the modified examples of the second embodiment.

Figure 30:
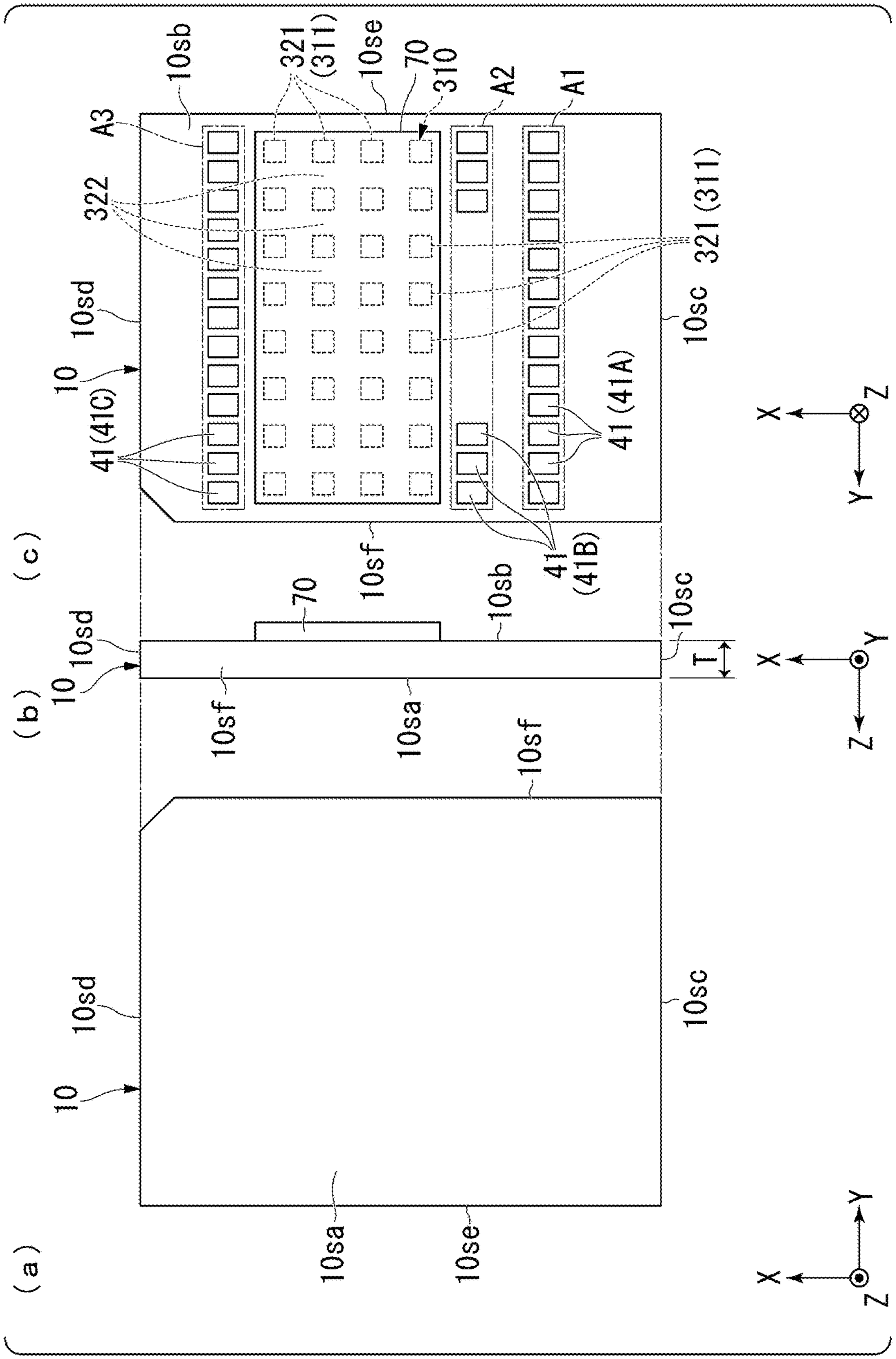
FIG. 30 is a view showing a semiconductor storage device according to a third embodiment.

FIG. 30 is a view showing the semiconductor storage device 10 according to the third embodiment. In the present embodiment, the solder resist layer 32 has the non-planar portion 310. The non-planar portion 310 is provided in a region between a region A2 and a region A3. The non-planar portion 310 is an example of a "third non-planar portion". The non-planar portion 310 is covered with, for example, a thermally conductive sheet 70. The thermally conductive sheet 70 is in contact with the non-planar portion 310.

Figure 31A:
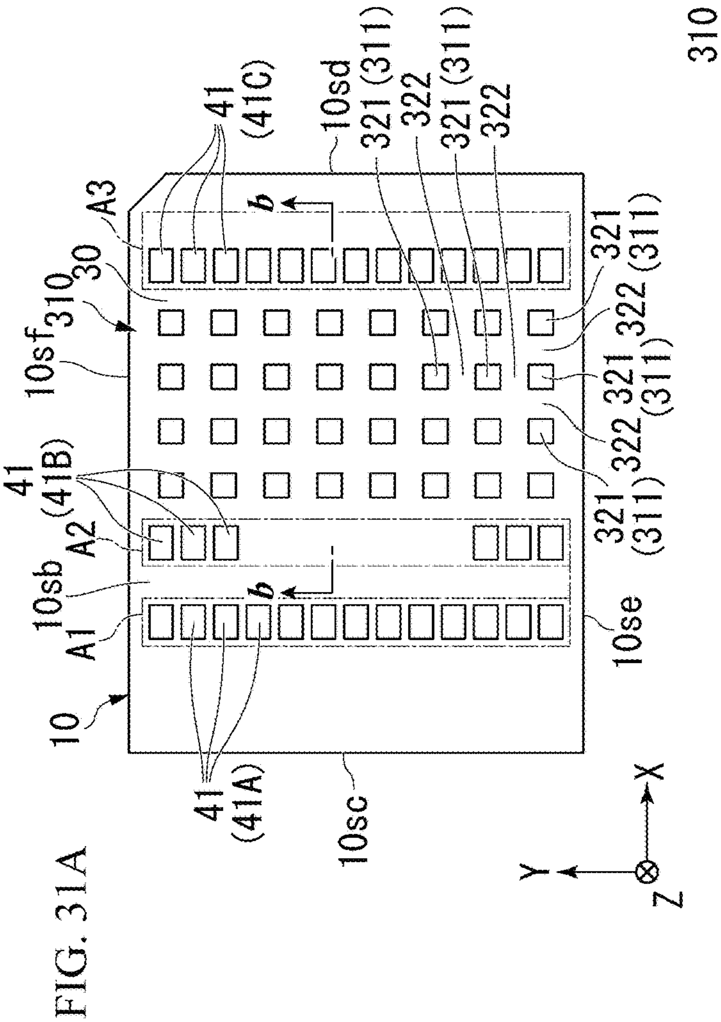
FIG. 31A is a plan view showing the semiconductor storage device according to the third embodiment.
Figure 31B:
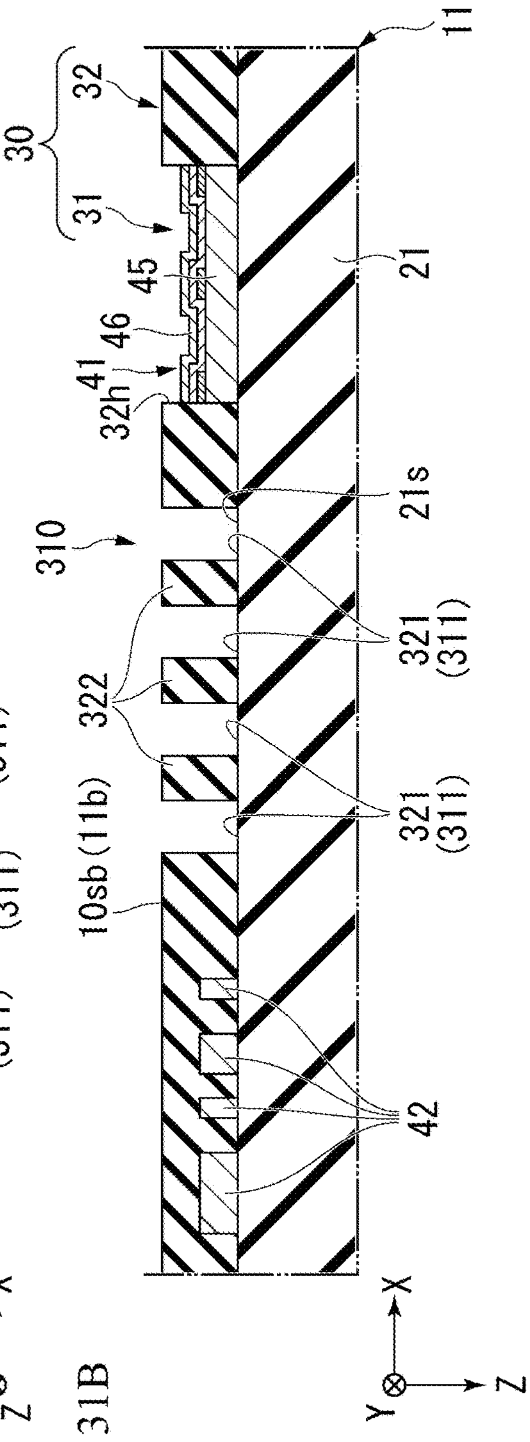
FIG. 31B is a view showing the semiconductor storage device according to the third embodiment, and is a cross-sectional view taken along line b-b shown in FIG. 31A.

FIGS. 31A and 31B is a view showing the semiconductor storage device 10 according to the third embodiment. A surface layer portion 30 has the non-planar portion 310. When viewed from the Z direction, the non-planar portion 310 is provided in a region of the surface layer portion 30 outside a plurality of terminals 41. The non-planar portion 310 has a plurality of recesses 311. The plurality of recesses 311 are disposed to be aligned in a matrix shape of, for example, four rows in the X direction and eight rows in the Y direction. The recess 311 is a bottomed hole portion provided in the solder resist layer 32. The recess 311 reaches a position closer to an insulating base 21 than the part of the terminals 41 in the Z direction. For example, the recess 311 reaches a surface 21*s* of the insulating base 21. In the present embodiment, the non-planar portion 310 has an uneven structure in which recessed portions 321 and protruding portions 322 are alternately aligned due to provision of the plurality of recesses 311 described above. For example, the recessed portions 321 and the protruding portions 322 are aligned alternately in each of the X direction and the Y direction. The recessed portion 321 is an example of a "third recessed portion". The protruding portion 322 is an example of a "third protruding portion". Note that, details of the non-planar portion 310 are described in the specification of Japanese Patent Application No. 2023-149155. This literature is incorporated in the present specification by reference in its entirety.

Fourth Embodiment

Next, a fourth embodiment will be described. The fourth embodiment differs from the first embodiment or the second embodiment in that the solder resist layer 32 has a non-planar portion 310A. Note that, configurations other than those described below are the same as the configurations of the first embodiment or the second embodiment. A terminal 41 of a semiconductor storage device 10 according to the fourth embodiment has a non-planar portion 50, 50A, 120, 120A, or 170 similar to any one of that in the first embodiment, the modified examples of the first embodiment, the second embodiment, and the modified examples of the second embodiment.

Figure 32A:
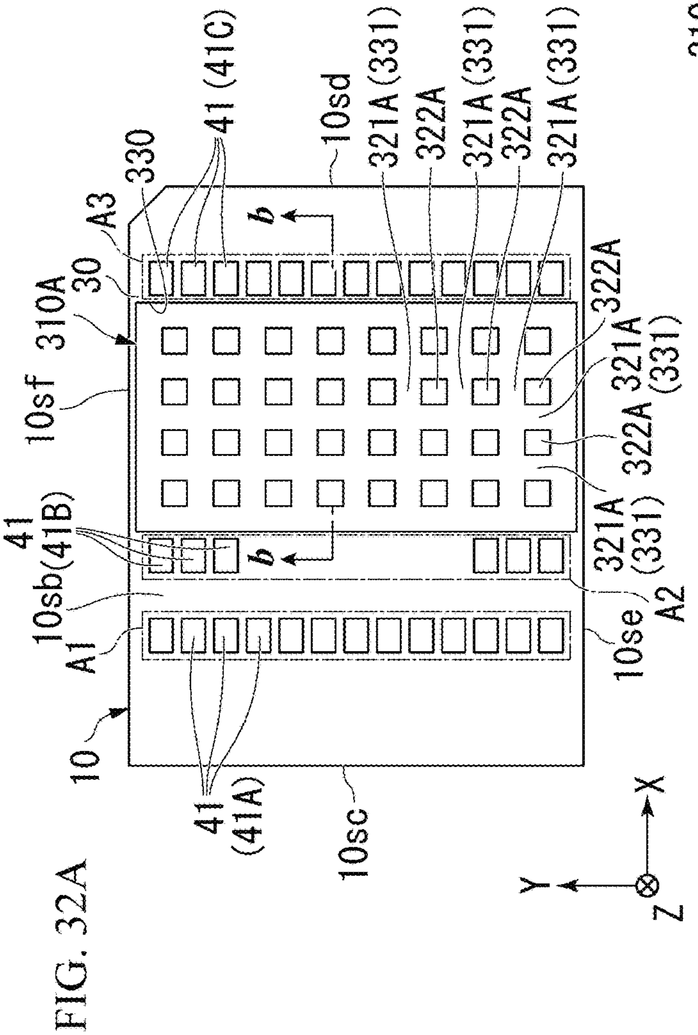
FIG. 32A is a plan view showing a semiconductor storage device according to a fourth embodiment.
Figure 32B:
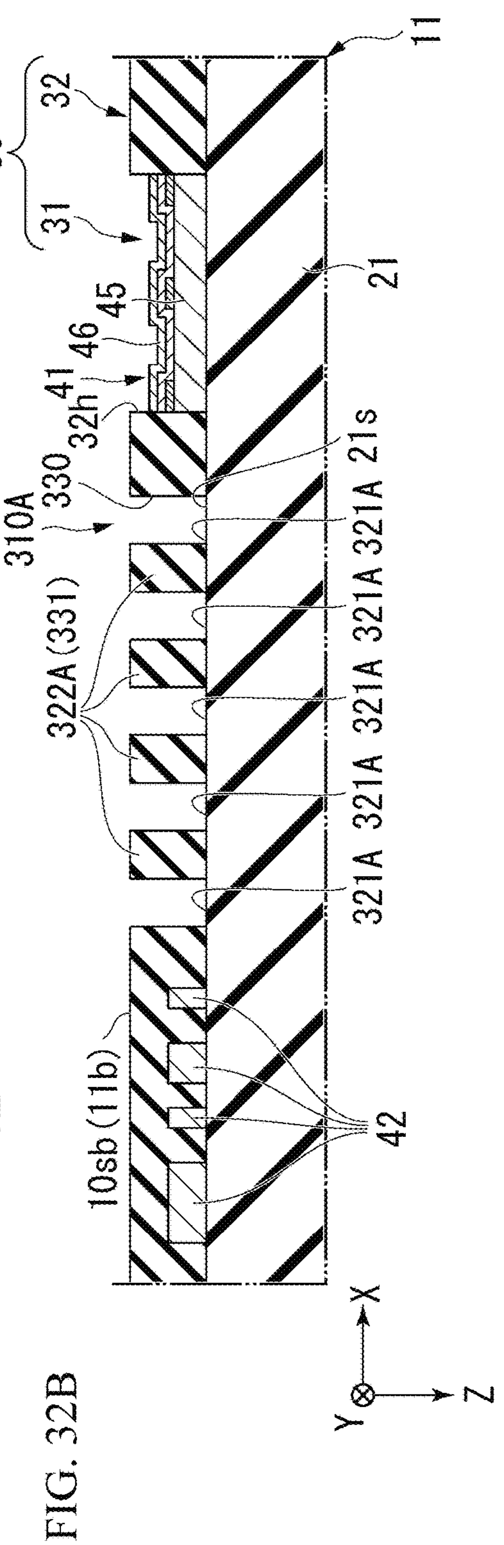
FIG. 32B is a view showing a semiconductor storage device according to the fourth embodiment, and is a cross-sectional view taken along line b-b shown in FIG. 32A.

FIGS. 32A and 32B are views showing the semiconductor storage device 10 according to the fourth embodiment. In the present embodiment, the solder resist layer 32 has the non-planar portion 310A. The non-planar portion 310A is provided in a region between a region A2 and a region A3. The non-planar portion 310A is an example of a "third non-planar portion". The non-planar portion 310A is covered with, for example, a thermally conductive sheet 70. The thermally conductive sheet 70 is in contact with the non-planar portion 310A.

The non-planar portion 310A is provided in a region of a surface layer portion 30 outside a plurality of terminals 41 when viewed from the Z direction. The non-planar portion 310A has a recess 330 and a plurality of protrusions 331. The recess 330 is recessed in a direction toward an insulating base 21 with respect to the region A2 and the region A3. The recess 330 reaches a position closer to the insulating base 21 than the part of the terminals 41 in the Z direction. For example, the recess 330 reaches a surface 21*s* of the insulating base 21.

The plurality of protrusions 331 are provided in the recess 330. Each of the protrusions 331 is a columnar protrusion that protrudes in the Z direction inside the recess 330. For example, each protrusion 331 protrudes from the surface 21*s* of the insulating base 21 in a direction away from the insulating base 21. The plurality of protrusions 331 are disposed to be aligned in a matrix shape of, for example, four rows in the X direction and eight rows in the Y direction. In the present embodiment, the non-planar portion 310A has an uneven structure in which recessed portions 321A and protruding portions 322A are alternately aligned due to provision of the plurality of protrusions 331. For example, the recessed portions 321A and the protruding portions 322A are disposed alternately in each of the X direction and the Y direction. The recessed portion 321A is an example of a "third recessed portion". The protruding portion 322A is an example of a "third protruding portion". Note that, details of the non-planar portion 310A are described in the specification of the Japanese Patent Application No. 2023-149155 described above.

Modified Example Common to First to Fourth Embodiments

Next, a modified example common to the first to fourth embodiments will be described.

Figure 33A:
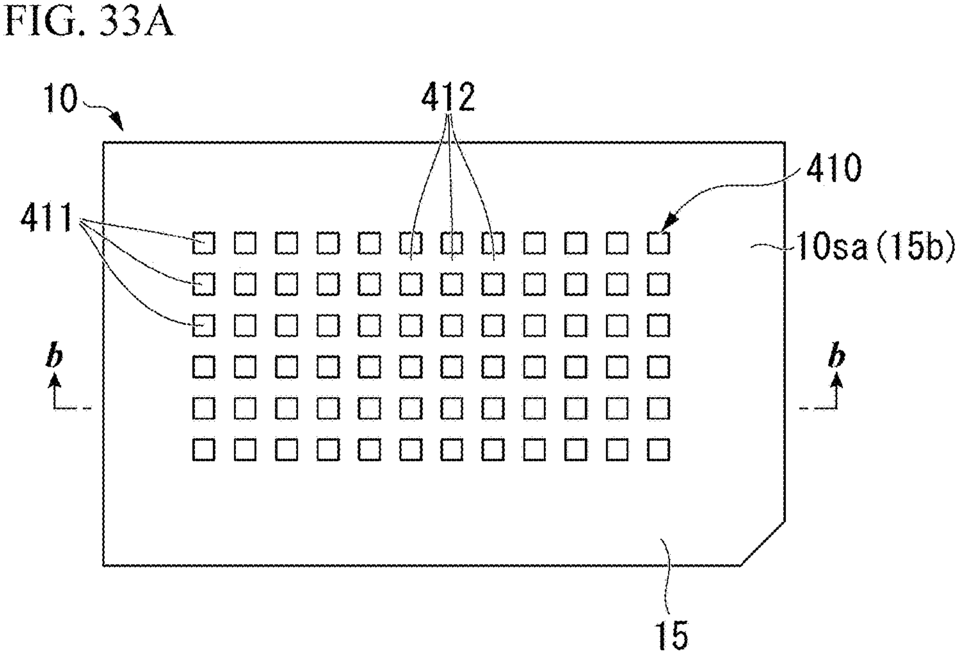
FIG. 33A is a plan view showing a semiconductor storage device of a modified example of the first to fourth embodiments.
Figure 33B:
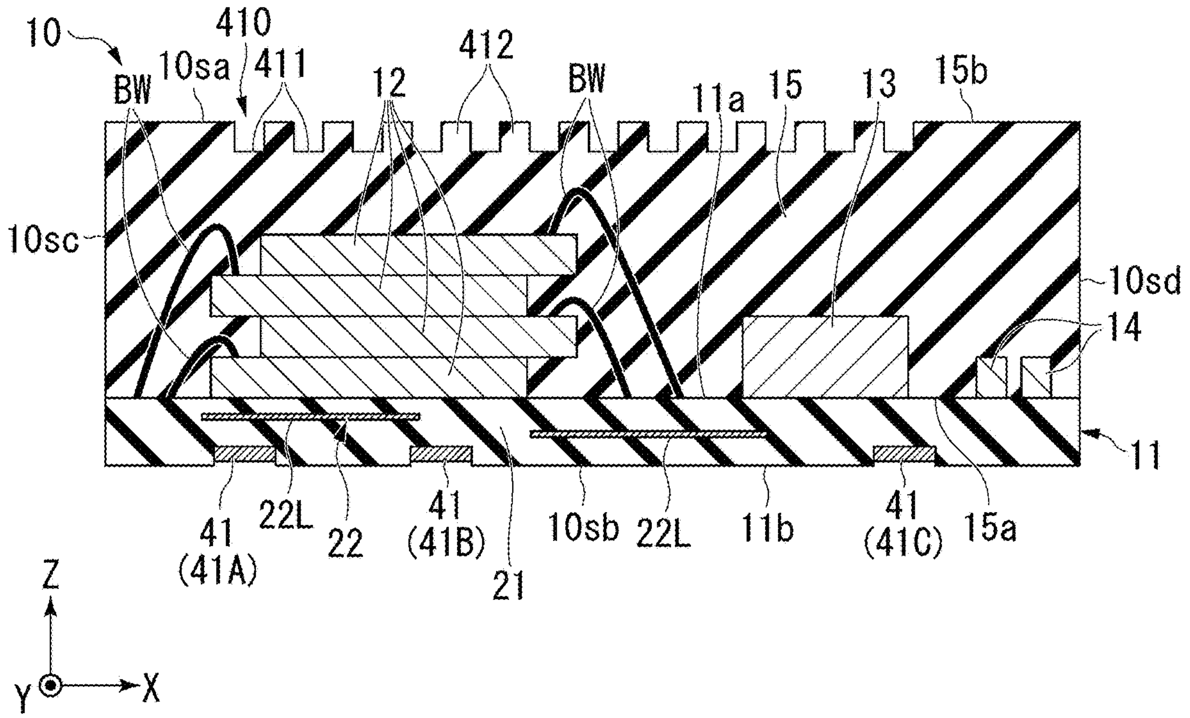
FIG. 33B is a view showing a semiconductor storage device of a modified example of the first to fourth embodiments, and is a cross-sectional view taken along line b-b shown in FIG. 33A.

FIGS. 33A and 33B are views showing a semiconductor storage device 10 of a modified example of the first to fourth embodiments. In the present modified example, the molded resin 15 has the second surface 15*b* positioned on a side opposite to the board 11. The second surface 15*b* has a non-planar portion 410 in which recessed portions 411 and protruding portions 412 are alternately aligned. The recessed portions 411 and the protruding portions 412 are aligned alternately, for example, in each of the X direction and the Y direction.

The plurality of recessed portions 411 are disposed at regular intervals in the X direction. Also, the plurality of recessed portions 411 are disposed at regular intervals in the Y direction. The protruding portion 412 is defined between two recessed portions 411 adjacent to each other due to provision of the plurality of recessed portions 411. In the present application, the term "protruding portion" refers to a portion that protrudes in a direction away from the insulating base 21 compared to a bottom of the recessed portion 411. In the present embodiment, the protruding portion 412 is formed of the same insulating material as the molded resin 15.

According to such a configuration, the heat dissipation area of the semiconductor storage device 10 can be further increased. Therefore, further improvement in heat dissipation of the semiconductor storage device 10 can be achieved.

The first to fourth embodiments and the modified examples have been described above. However, the embodiments and the modified examples are not limited to the examples described above. For example, the thermally conductive sheet 70 is not an essential component. Also, the semiconductor storage device 10 is not limited to a case in which the recessed portions and the protruding portions are formed by only one of the plurality of recesses and the plurality of protrusions. For example, the semiconductor storage device 10 may have both the plurality of recesses and the plurality of protrusions to form the recessed portions and the protruding portions.

Also, the connector 90 is not limited to a hinge type (clamshell type) connector. For example, the connector 90 may be a push-pull type connector or may be a push-push type connector.

According to at least one of the embodiments described above, a semiconductor storage device includes a first board, a molded resin, and a memory chip. The first board has a first surface and a second surface positioned on a side opposite to the first surface. The molded resin covers the first surface when viewed in a thickness direction of the first board. The memory chip is disposed between the first surface and the molded resin. The first board includes a terminal provided on the second surface and exposed to the outside. The terminal includes a first non-planar portion. The first non-planar portion includes at least one of a plurality of recesses and a plurality of protrusions. The first non-planar portion includes first recessed portions and first protruding portions. The first recessed portions and first protruding portions are aligned alternately on the first non-planar portion. According to such a configuration, an improvement in heat dissipation of the semiconductor storage device can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:

a first board including a first surface and a second surface, the second surface being on a side of the first board opposite to the first surface thereof;

a molded resin covering the first surface as viewed in a thickness direction of the first board; and a memory chip provided between the first surface and the molded resin, wherein:

the first board includes a terminal, the terminal being provided on the second surface, and the terminal being exposed to outside, the terminal includes a first non-planar portion provided on an outer surface of the terminal, the first non-planar portion includes at least one of a plurality of recesses and a plurality of protrusions, the first non-planar portion includes a first recessed portion and a first protruding portion, and the first recessed portion and the first protruding portion are aligned alternately on the first non-planar portion.

2. The semiconductor storage device according to claim 1, wherein the semiconductor storage device is detachably attachable to a socket connector on a second board of a host device.

3. The semiconductor storage device according to claim 2, wherein the semiconductor storage device is detachably attachable to the connector in a state in which a contact pin of the connector is in contact with the terminal.

4. The semiconductor storage device according to claim 3, wherein:

the contact pin includes a curved portion, the curved portion is at a distal end part of the contact pin and is curved toward a side opposite to the terminal, the terminal includes a first region and a second region, as viewed in a thickness direction of the first board:

the first region has at least a part overlapping the curved portion, and the second region is outside the first region, and the first non-planar portion is at least in the second region.

5. The semiconductor storage device according to claim 4, wherein:

the first region includes a planar portion, and the planar portion is flatter than the first non-planar portion.

6. The semiconductor storage device according to claim 5, wherein, in a case in which an extension direction of the contact pin is defined as a first direction and a direction intersecting the first direction is defined as a second direction, a width of the planar portion in the second direction is larger than a width of the first protruding portion in the second direction.

7. The semiconductor storage device according to claim 6, wherein the width of the planar portion in the second direction is larger than a width of the curved portion of the contact pin in the second direction.

8. The semiconductor storage device according to claim 4, wherein, in a case in which an extension direction of the contact pin is defined as a first direction and a direction intersecting the first direction is defined as a second direction:

the first region includes a second non-planar portion, the second non-planar portion includes at least one of a plurality of recesses and a plurality of protrusions, the second non-planar portion includes a second recessed portion and a second protruding portion, the second recessed portion and the second protruding portion are aligned alternately on the second non-planar portion, and a width of the second protruding portion in the second direction is larger than a width of the second protruding portion in the first direction as viewed from a thickness direction of the first board.

9. The semiconductor storage device according to claim 8, wherein the width of the second protruding portion in the second direction is larger than a width of the first protruding portion in the second direction.

10. The semiconductor storage device according to claim 8, wherein the width of the second protruding portion in the second direction is larger than a width of the curved portion of the contact pin in the second direction.

11. The semiconductor storage device according to claim 8, wherein an edge in the first direction of at least one second protruding portion includes an inclined portion inclined with respect to the first surface.

12. The semiconductor storage device according to claim 4, wherein, in a case in which an extension direction of the contact pin is defined as a first direction and a direction intersecting the first direction is defined as a second direction:

the first non-planar portion is in the first region and the second region, and an edge in the first direction of at least one first protruding portion in the first region includes an inclined portion inclined with respect to the first surface.

13. The semiconductor storage device according to claim 4, wherein, in a case in which an extension direction of the contact pin is defined as a first direction and a direction intersecting the first direction is defined as a second direction:

the first region includes a second non-planar portion, the second non-planar portion includes at least one of a plurality of recesses and a plurality of protrusions, the second non-planar portion includes a second recessed portion and a second protruding portion, the second recessed portion and the second protruding portion are aligned alternately on the second non-planar portion, and a width of the second protruding portion in the first direction is larger than a width of the second protruding portion in the second direction.

14. The semiconductor storage device according to claim 13, wherein the width of the second protruding portion in the first direction is a half or more of a width of the terminal in the first direction.

15. The semiconductor storage device according to claim 13, wherein a center of the second protruding portion in the first direction is displaced to one side in the first direction with respect to a center of the terminal in the first direction.

16. The semiconductor storage device according to claim 4, wherein:

the first region includes a receiving portion, the curved portion of the contact pin comes into contact with the receiving portion, and the receiving portion includes a curved surface portion curved in a same direction as a curving direction of the curved portion.

17. The semiconductor storage device according to claim 1, wherein:

the first board includes a surface layer portion, the surface layer portion is a surface layer portion forming the second surface, the surface layer portion includes a conductive pattern including the terminal, the surface layer portion includes an insulating layer covering a part of the conductive pattern, the surface layer portion includes a third non-planar portion in a region outside the terminal, the third non-planar portion includes at least one of a plurality of recesses and a plurality of protrusions, the third non-planar portion includes a third recessed portion and a third protruding portion, and the third recessed portion and the third protruding portion are aligned alternately on the third non-planar portion.

* * * * *